United States Patent
Chen et al.

(10) Patent No.: US 10,020,379 B2
(45) Date of Patent: Jul. 10, 2018

(54) METHOD FOR FORMING SEMICONDUCTOR DEVICE STRUCTURE USING DOUBLE PATTERNING

(71) Applicant: Taiwan Semiconductor Manufacturing Co., Ltd., Hsinchu (TW)

(72) Inventors: Po-Ju Chen, Hsinchu (TW); Yi-Wei Chiu, Kaohsiung (TW)

(73) Assignee: Taiwan Semiconuctor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/355,364

(22) Filed: Nov. 18, 2016

(65) Prior Publication Data
US 2018/0145145 A1  May 24, 2018

(51) Int. Cl.
| | |
|---|---|
| *H01L 29/66* | (2006.01) |
| *H01L 21/306* | (2006.01) |
| *H01L 21/308* | (2006.01) |

(52) U.S. Cl.
CPC ...... *H01L 29/6656* (2013.01); *H01L 21/3085* (2013.01); *H01L 21/30604* (2013.01)

(58) Field of Classification Search
CPC ........... H01L 29/6656; H01L 29/30604; H01L 29/3085
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,343 B2 | 9/2014 | Hsieh et al. | |
| 9,455,177 B1 * | 9/2016 | Park | H01L 21/76828 |
| 2006/0091468 A1 | 5/2006 | Liaw | |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2017/0207338 A1 * | 7/2017 | Chiu | H01L 29/7853 |

* cited by examiner

*Primary Examiner* — Duy Vu N Deo
(74) *Attorney, Agent, or Firm* — Birch, Stewart, Kolasch & Birch, LLP

(57) ABSTRACT

A method for forming a semiconductor device structure is provided. The method includes forming a mandrel masking structure over a target layer. The method also includes patterning the mandrel masking structure to form mandrel lines parallel to each other, and forming spacer structures on sidewalls of the respective mandrel lines to define first openings. Each of the spacer structures includes a first spacer and a second spacer between the first spacer and the corresponding mandrel line. The method also includes removing the mandrel lines to define second openings, and etching the target layer through the first and second openings to form a target pattern therein.

20 Claims, 25 Drawing Sheets

METHOD FOR FORMING SEMICONDUCTOR DEVICE STRUCTURE USING DOUBLE PATTERNING

BACKGROUND

The semiconductor industry has experienced rapid growth and demands for highly integrated semiconductor devices are increasing. However, these demands have increased the complexity of processing and manufacturing semiconductor devices for integrated circuits (ICs) and, for these demands to be met, similar developments in IC processing and manufacturing are needed. In the course of IC evolution, functional density has generally increased while geometric size (i.e., the smallest component (or line) that can be created through a fabrication process) has decreased.

For example, as the size of features is scaled down, it may be difficult to form these features having the desired size using conventional photolithography processes because the wavelength of the light sourced for these photolithography processes is reaching its technical limitations.

To address this drawback, a double patterning technology has been developed to form the semiconductor features having small geometric sizes. In the double patterning method, mandrels are formed over a layer to be etched by photolithography and etching processes. Afterwards, spacers are formed on the sidewalls of the mandrels. The mandrels are then removed to leave the spacers that are used as an etch mask for definition of the underlying layer.

Although existing doubling patterning methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
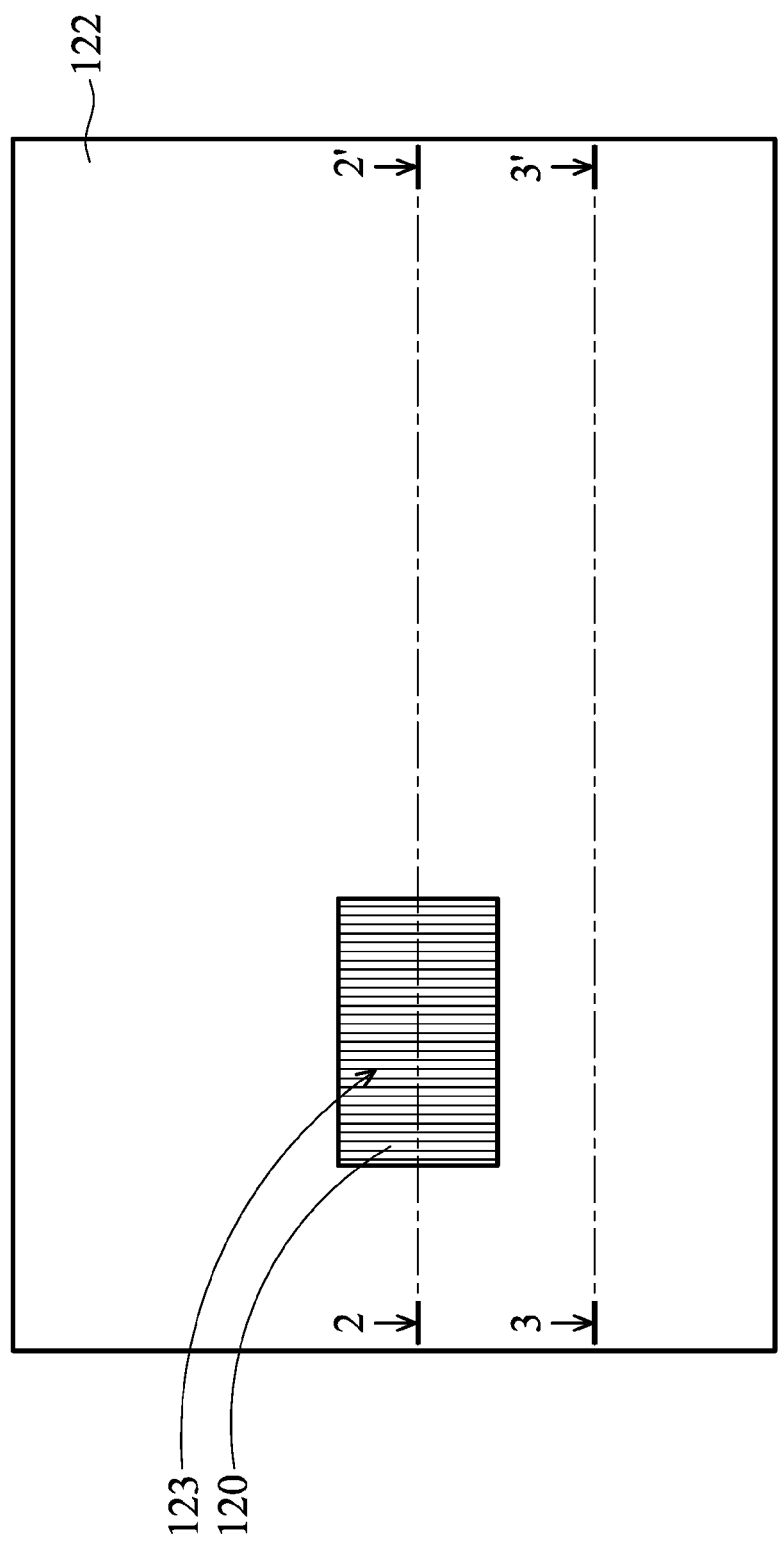
FIGS. 1A to 1H are plan views of various stages of a method of forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods for forming a semiconductor device structure are provided in accordance with exemplary embodiments. The intermediate stages of forming the semiconductor device structure in accordance with embodiments are illustrated.

Some embodiments of the disclosure are described. FIGS. 1A to 1H are plan views of various stages of a method of forming a semiconductor device structure, in accordance with some embodiments. Moreover, FIGS. 2A to 2H are cross-sectional views along a sectional line 2-2' in FIGS. 1A to 1H, respectively, in accordance with some embodiments, and FIGS. 3A to 3H are cross-sectional views along a sectional line 3-3' in FIGS. 1A to 1H, respectively, in accordance with some embodiments. Additional operations can be provided before, during, and/or after the stages described in FIGS. 1A to 1H. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
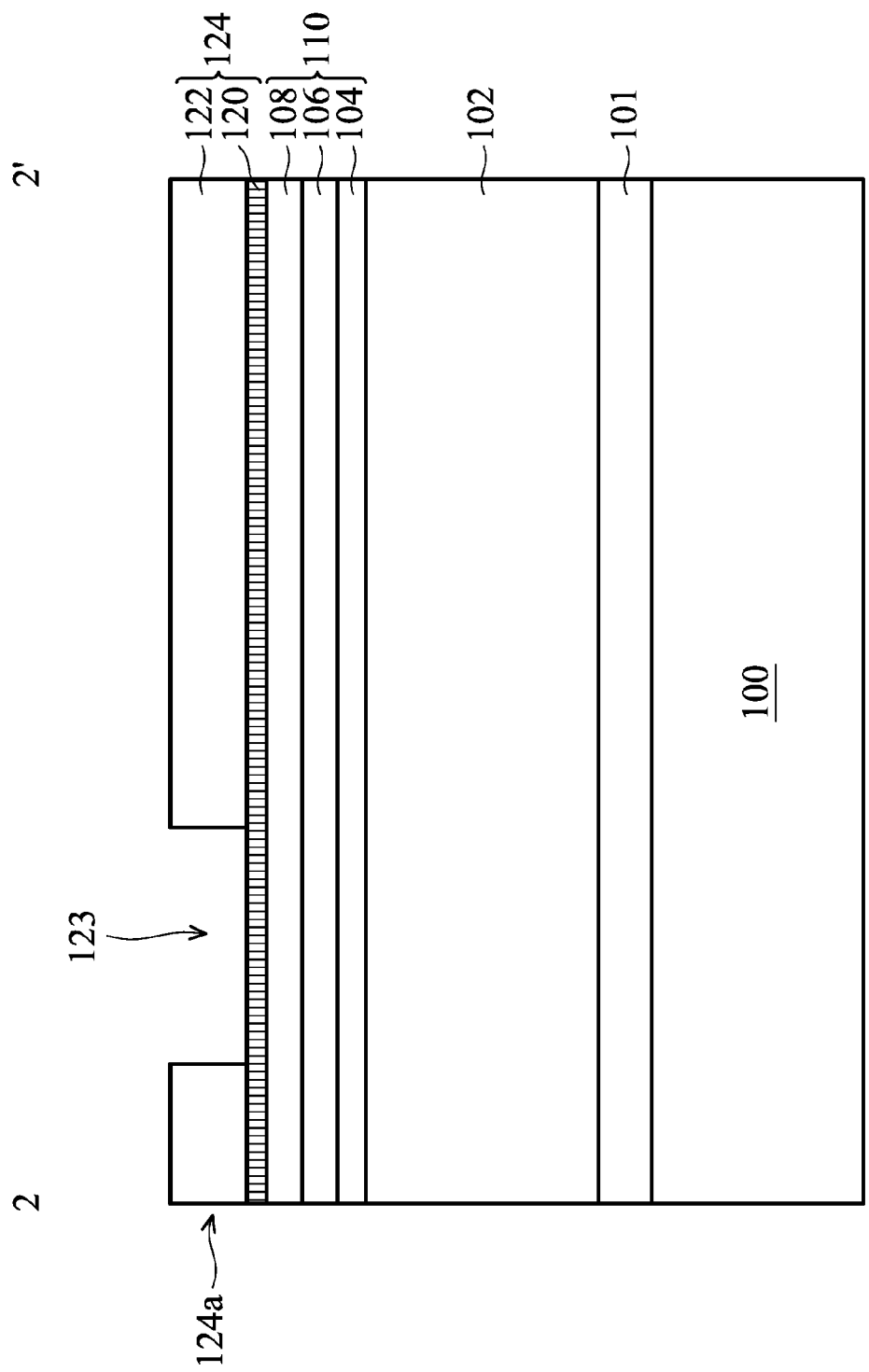
FIGS. 2A to 2H are cross-sectional views along a sectional line 2-2' in FIGS. 1A to 1H, respectively, in accordance with some embodiments.
Figure 3A:
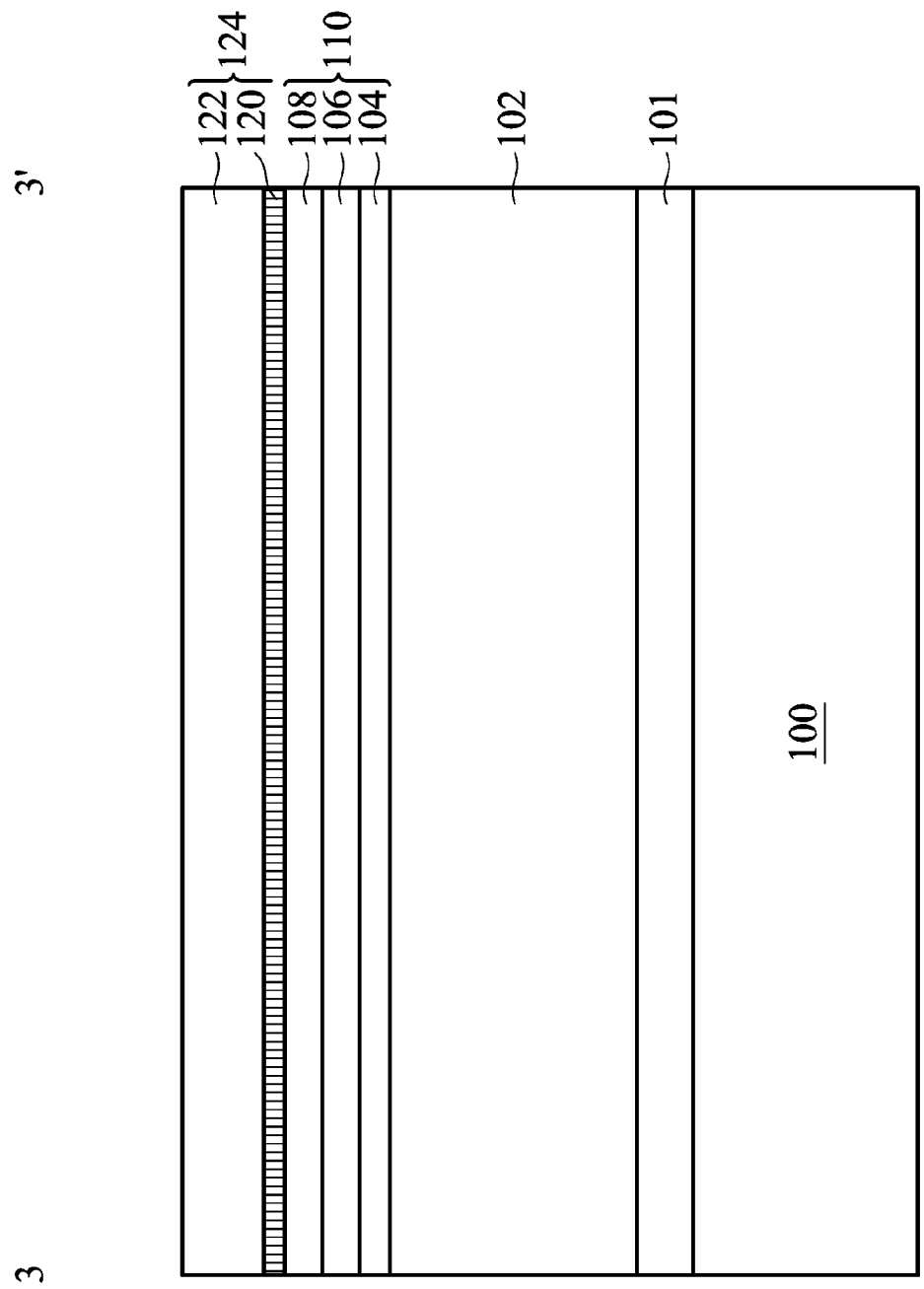
FIGS. 3A to 3H are cross-sectional views along a sectional line 3-3' in FIGS. 1A to 1H, respectively, in accordance with some embodiments.

As shown in FIGS. 1A, 2A, and 3A, a device wafer is provided, in accordance with some embodiments. The device wafer may include a substrate 100 and the overlying layers. The substrate 100 may be formed of a semiconductor material, such as silicon, silicon germanium, or the like. In some embodiments, the substrate 100 is made of an elementary semiconductor material including silicon or germanium in a single crystal, polycrystal, or amorphous structure.

In some other embodiments, the substrate 100 is made of a compound semiconductor, such as silicon carbide, gallium arsenide, gallium phosphide, indium phosphide, indium arsenide, an alloy semiconductor, such as SiGe, or GaAsP, or a combination thereof. The substrate 100 may also include multi-layer semiconductors, semiconductor on insulator (SOI) (such as silicon on insulator or germanium on insulator), or a combination thereof. Active devices, such as transistors, may be formed in the substrate 100 or at a top surface thereof.

As shown in FIGS. 1A, 2A, and 3A, an insulating layer 101 is formed over the substrate 100, in accordance with some embodiments. In some embodiments, the insulating layer 101 is an inter-layer dielectric (ILD) layer or an inter-metal dielectric (IMD) layer, which may be formed of a dielectric layer including silicon oxide, borosilicate glass (BSG), phosphoric silicate glass (PSG), borophosphosilicate glass (BPSG), fluorinated silicate glass (FSG), tetraethyl orthosilicate (TEOS) oxide, or a combination thereof, for example. Alternatively, the insulating layer 101 may include a low-k dielectric material or a porous dielectric material having low k value (dielectric constant). The k value of the low-k dielectric material or porous dielectric material may be lower than about 3.0, or lower than about 2.5, for example.

In some embodiments, the insulating layer 101 is formed by a spin-on process, a chemical vapor deposition (CVD) process (such as a low-pressure CVD (LPCVD) process, a plasma-enhanced CVD (PECVD) process, or a high-density plasma CVD (HDPCVD) process), or another suitable method.

In some embodiments, conductive features (not shown), such as conductive lines (i.e., copper lines), conductive vias (i.e., tungsten plugs) or a combination thereof, are formed in the insulating layer 101. In some embodiments, an etch stop layer (not shown) is formed over the insulating layer. The etch stop layer may be formed of silicon nitride, silicon oxynitride, silicon carbide, or the like.

As shown in FIGS. 1A, 2A, and 3A, an insulating layer 102 is formed over the etch stop layer overlying the insulating layer 101, in accordance with some embodiments. Throughout the description, the insulating layer 102 may be referred to as a target layer, which is to be etched and in which a target pattern including, for example, trenches, via holes, or the like, is to be formed.

In some embodiments, the insulating layer 102 that is to be etched is an IMD layer, which is formed of a dielectric material having a dielectric constant (k value) lower than about 3.8, lower than about 3.0, or lower than about 2.5. In alternative embodiments, the insulating layer 102 is formed of a dielectric layer including silicon oxide, BSG, PSG, BPSG, FSG, TEOS oxide, or a combination thereof. The insulating layer 102 may be formed by a spin-on process, a CVD process (such as an LPCVD process, a PECVD process, or an HDPCVD process), or another suitable method.

In some embodiments, a hard mask structure 110 is formed over the insulating layer 102. The hard mask structure 110 may be a single layer or a multi-layer structure. For example, the hard mask structure 110 may be a multi-layer structure including a first masking layer 106 and a second masking layer 108 on the first masking layer 106. In some embodiments, the first masking layer 106 has a thickness in a range of about 50 nm to 500 nm and includes a metal or metal nitride material, such as titanium (Ti), titanium nitride (TiN), tantalum (Ta), tantalum nitride (TaN), aluminum nitride (AlN) or the like. In these cases, the first masking layer 106 may be formed by a physical vapor deposition (PVD) process (such as radio frequency PVD (RFPVD)), an atomic layer deposition (ALD) process, a CVD process, or another suitable method.

In these cases, the second masking layer 108 on the first masking layer 106 has a thickness in a range of about 50 nm to 500 nm and includes a dielectric material including silicon oxide (such as TEOS oxide), metal oxide (such as HfO, $AlO_x$, $TiO_x$), or silicon carbide. The second masking layer 108 may be formed by a PVD process (such as RFPVD), an ALD process, a CVD process, or another suitable method.

In some embodiments, the hard mask structure 110 further includes a third masking layer 104 below the first masking layer. For example, the third masking layer 104 may be a nitrogen-free anti-reflection coating (NFARC) layer (such as silicon oxide, silicon oxygen carbide, or the like) that may be formed by PECVD, HDPCVD, or the like.

In alternative embodiments, the hard mask structure 110 is a single layer including a metal nitride (such as AlN, TiN, or TaN), a metal oxide (such as HfO, $AlO_x$, $TiO_x$), silicon carbide, or the like. In these cases, the formation methods may include a PVD process (such as RFPVD), an ALD process, a CVD process (such as PECVD or HDPCVD), or another suitable method.

As shown in FIGS. 1A, 2A, and 3A, a mandrel masking structure 124 is formed over the hard mask structure 110, in accordance with some embodiments. The mandrel masking structure 124 may be a single layer or a multi-layer structure. For example, the mandrel masking structure 124 may be a multi-layer structure including a first mandrel layer 120 and a second mandrel layer 122 on the first mandrel layer 120. In some embodiments, the first mandrel layer 120 has a thickness in a range of about 10 nm to 300 nm and includes a material that is different from the second masking layer 108. For example, the first mandrel layer 120 includes silicon oxide or silicon nitride. In these cases, the first mandrel layer 120 may be formed by PECVD, HDPCVD, or another suitable method.

In some embodiments, the second mandrel layer 122 on the first mandrel layer 120 has a thickness in a range of about 300 nm to 700 nm and includes a material that has a hardness lower than that of the first mandrel layer 120 and the second masking layer 108. For example, second mandrel layer 122 includes polysilicon or amorphous silicon. In these cases, the second mandrel layer 122 may be formed by a PVD process (such as RFPVD), an ALD process, a CVD process, or another suitable method. In some embodiments, the second mandrel layer 122 includes another material that has a high etching selectivity with the first mandrel layer 120 and the second masking layer 108.

In alternative embodiments, the mandrel masking structure 124 is a single layer including polysilicon, amorphous silicon, or another material that has a high etching selectivity with the underlying second masking layer 108. In these cases, the mandrel masking structure 124 may be formed by a PVD process (such as RFPVD), an ALD process, a CVD process, or another suitable method.

As shown in FIGS. 1A, 2A, and 3A, a patterning process is performed on the mandrel masking structure 124, in accordance with some embodiments. The patterning process includes a first etching process (also referred to as a cut mandrel etching process) and a second etching process (also referred to as a mandrel etching process). In some embodiments, the first etching process includes a dry etching process (such as a plasma etching) or a wet etching process. In the first etching process, the mandrel masking structure 124 is patterned to form a cut opening 123 in the second mandrel layer 122, such that the first mandrel layer 120 is exposed therefrom. The cut opening 123 is used for removing the undesired portion(s) of the mandrel line that is formed in the subsequent second etching process. The first mandrel layer 120 serves as an etch stop layer for protecting the underlying layer(s) from damage.

In alternative embodiments, the mandrel masking structure 124 that is a single layer is patterned to form a cut opening in the mandrel masking structure 124, such that the second masking layer 108 is exposed therefrom. In these cases, the second masking layer 108 serves as an etch stop layer for protecting the underlying layer(s) from damage.

Figure 1B:
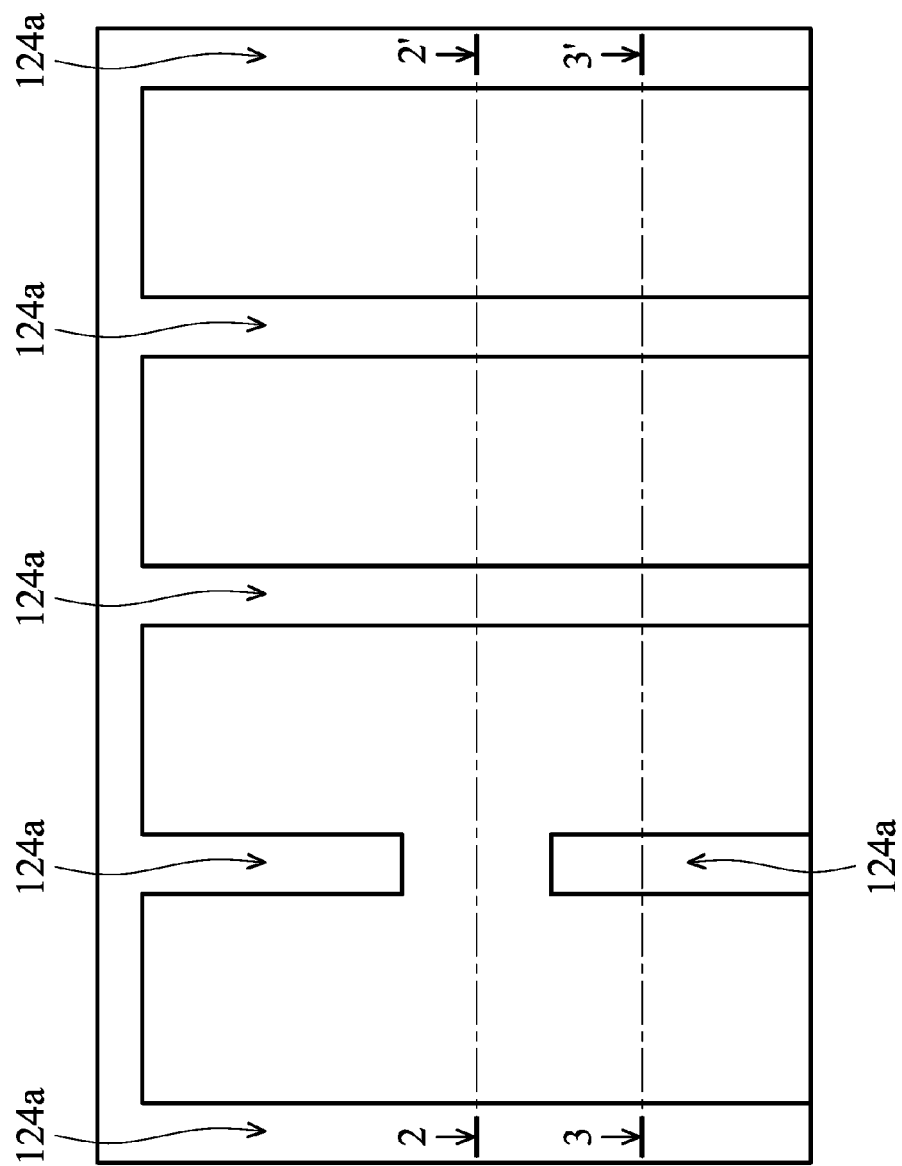
Figure 2B:
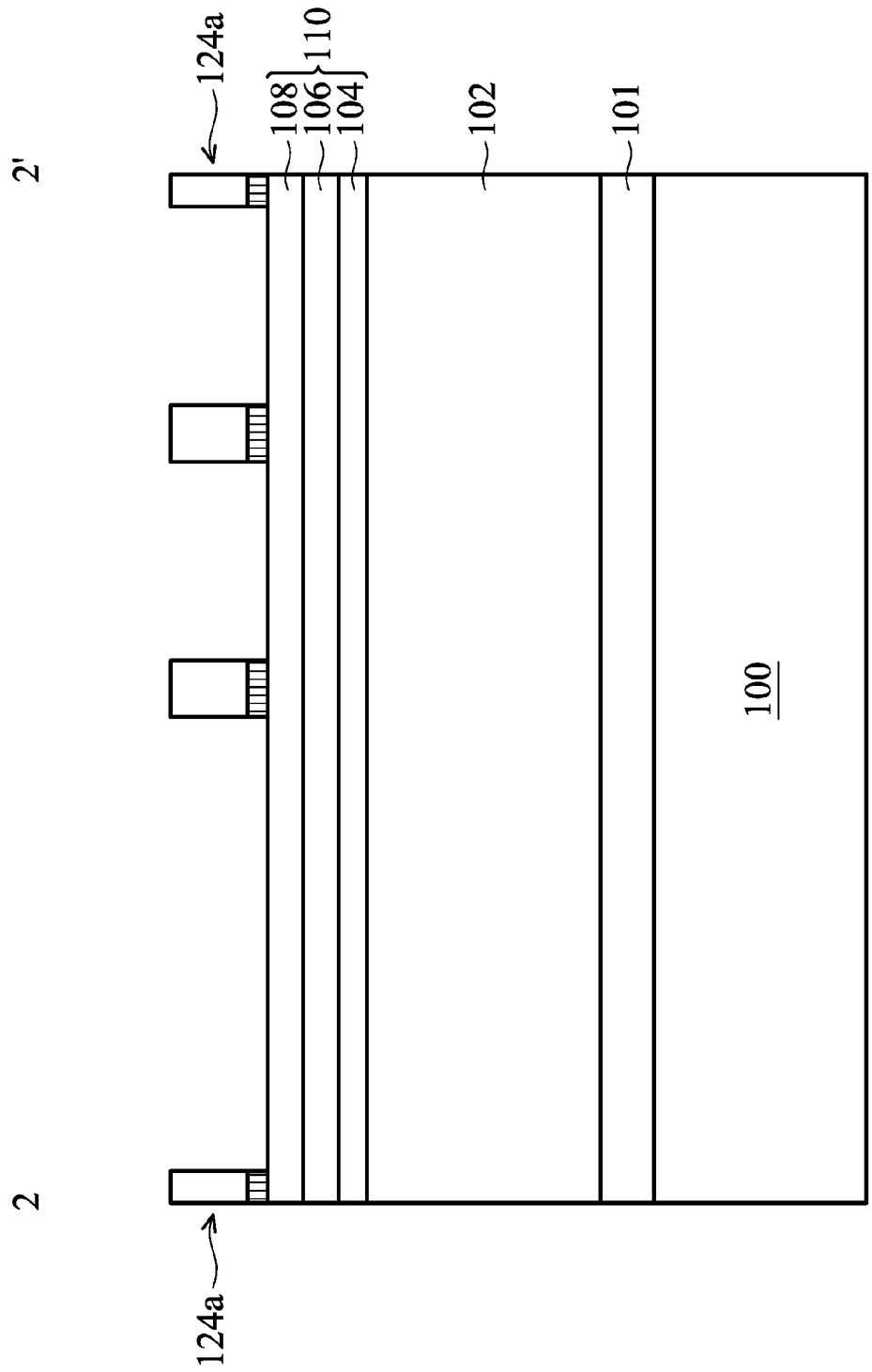
Figure 3B:
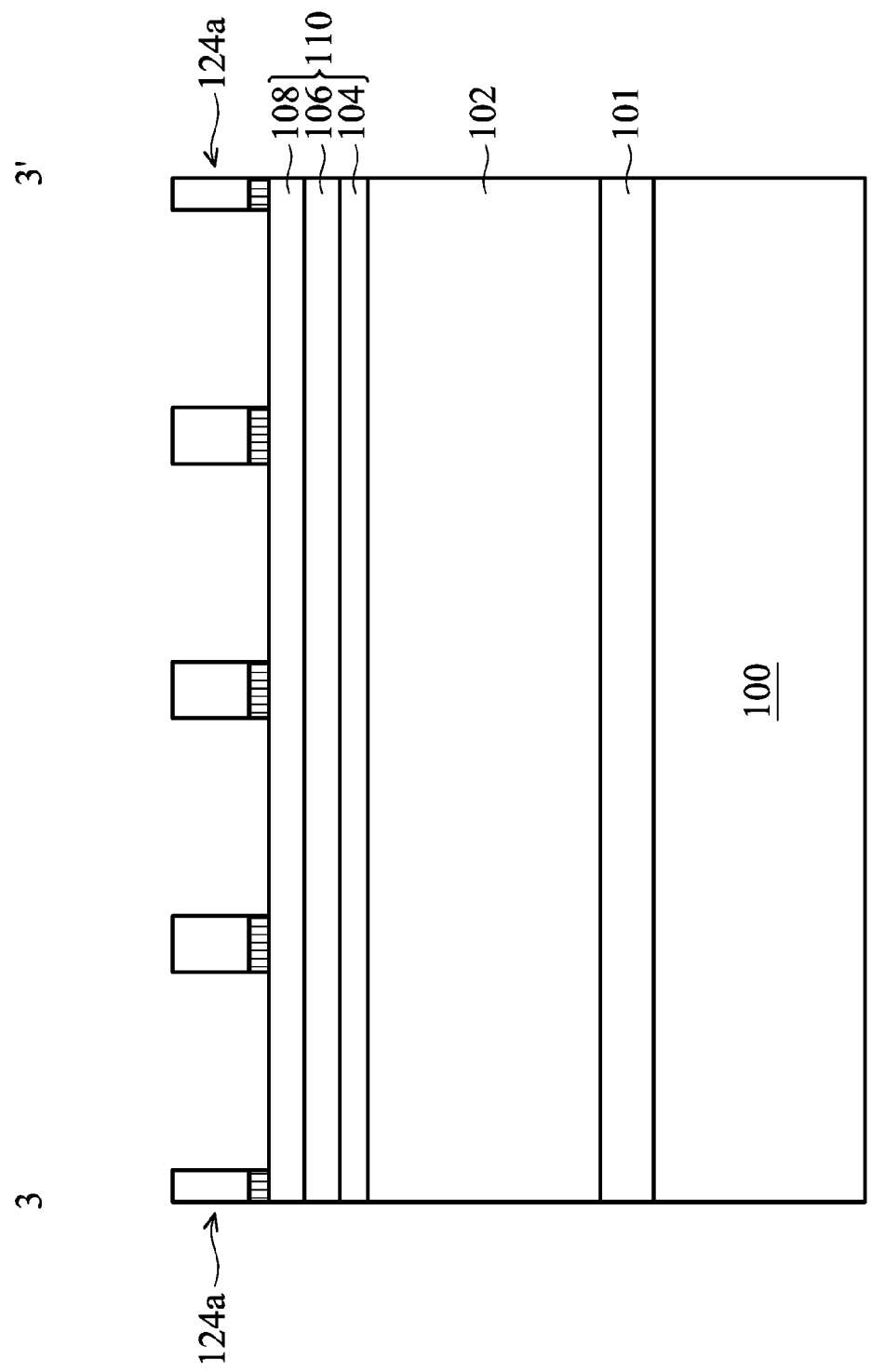

As shown in FIGS. 1B, 2B, and 3B, the second etching process (mandrel etching process) of the patterning process is performed on the mandrel masking structure 124, in accordance with some embodiments. In some embodiments, the second etching process includes a dry etching process (such as a plasma etching process) or a wet etching process. After the second etching process is performed, mandrel lines 124a, which are parallel to each other, are formed to expose the second masking layer 108. Each of the mandrel lines 124a is made of the first mandrel layer 120 and the second mandrel layer 122 in some embodiments. In these cases, the second masking layer 108 serves as a protective layer for preventing underlying layers from damage during the second etching process.

Moreover, one of the mandrel lines 124a is divided into two portions by the cut opening 123. Note that more than one cut opening 123 is formed in alternative embodiments, such that more than one of the mandrel lines 124a is divided into two portions or one of the mandrel lines 124a is divided into more than two portions.

Figure 1C:
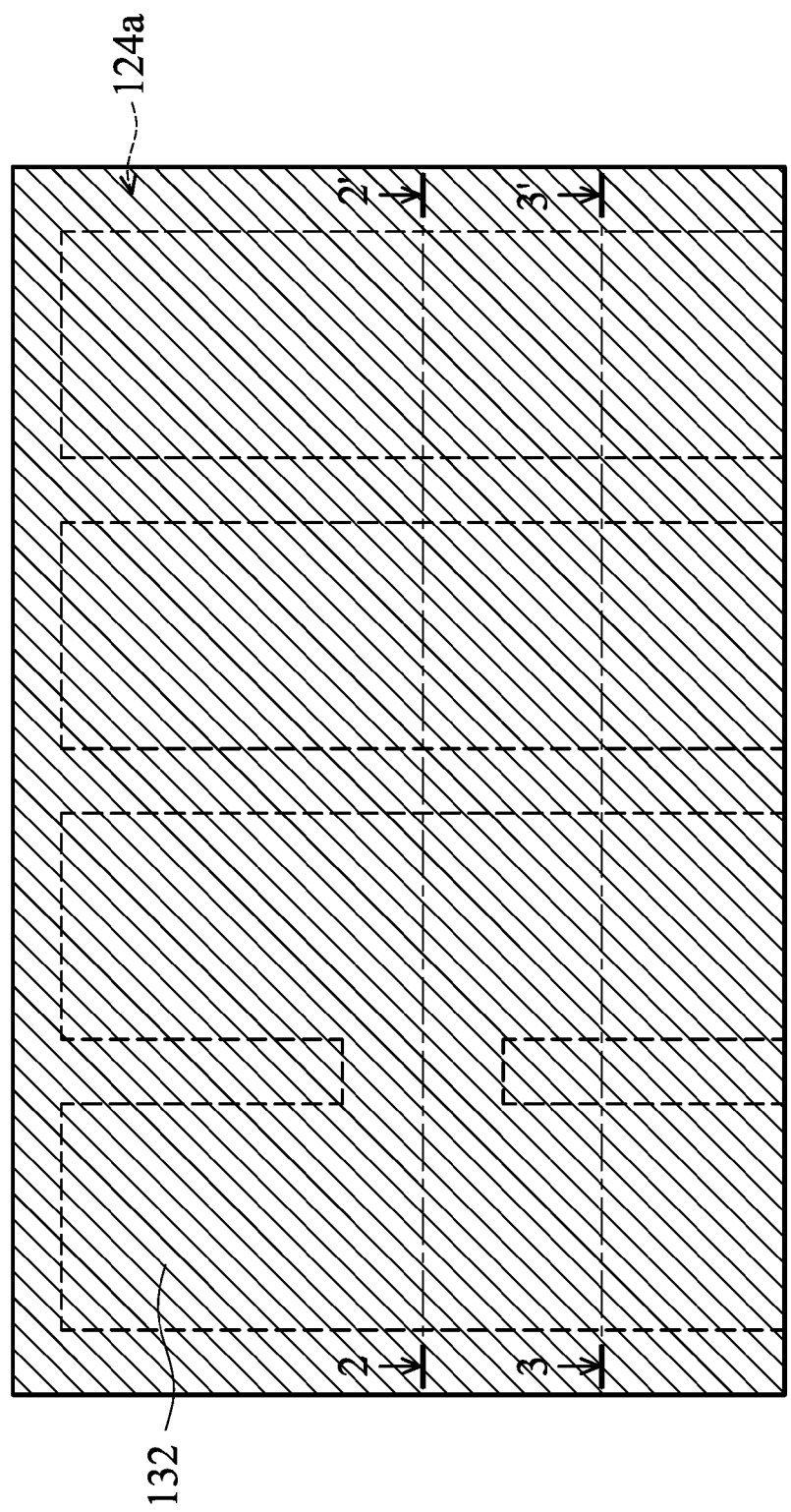
Figure 1D:
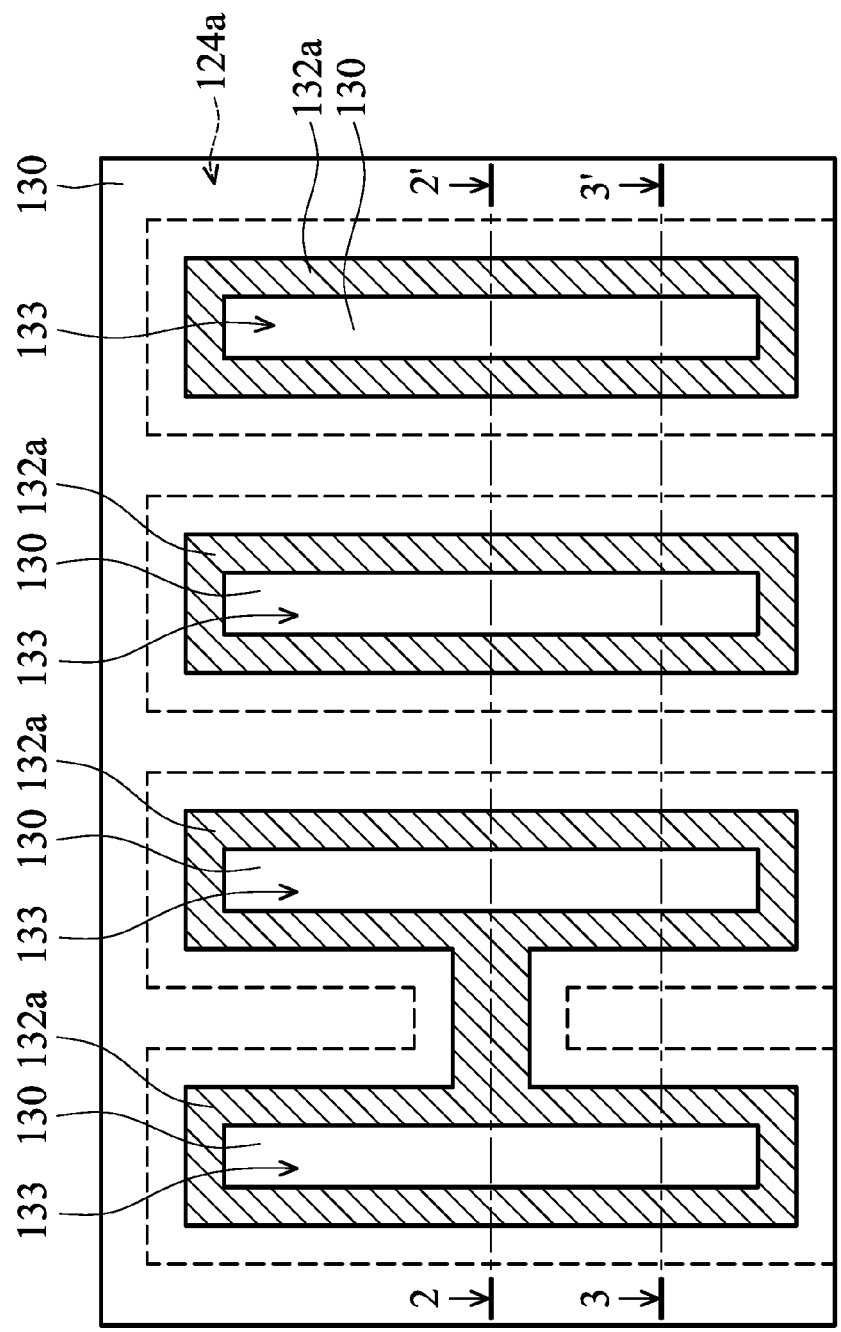
Figure 1E:
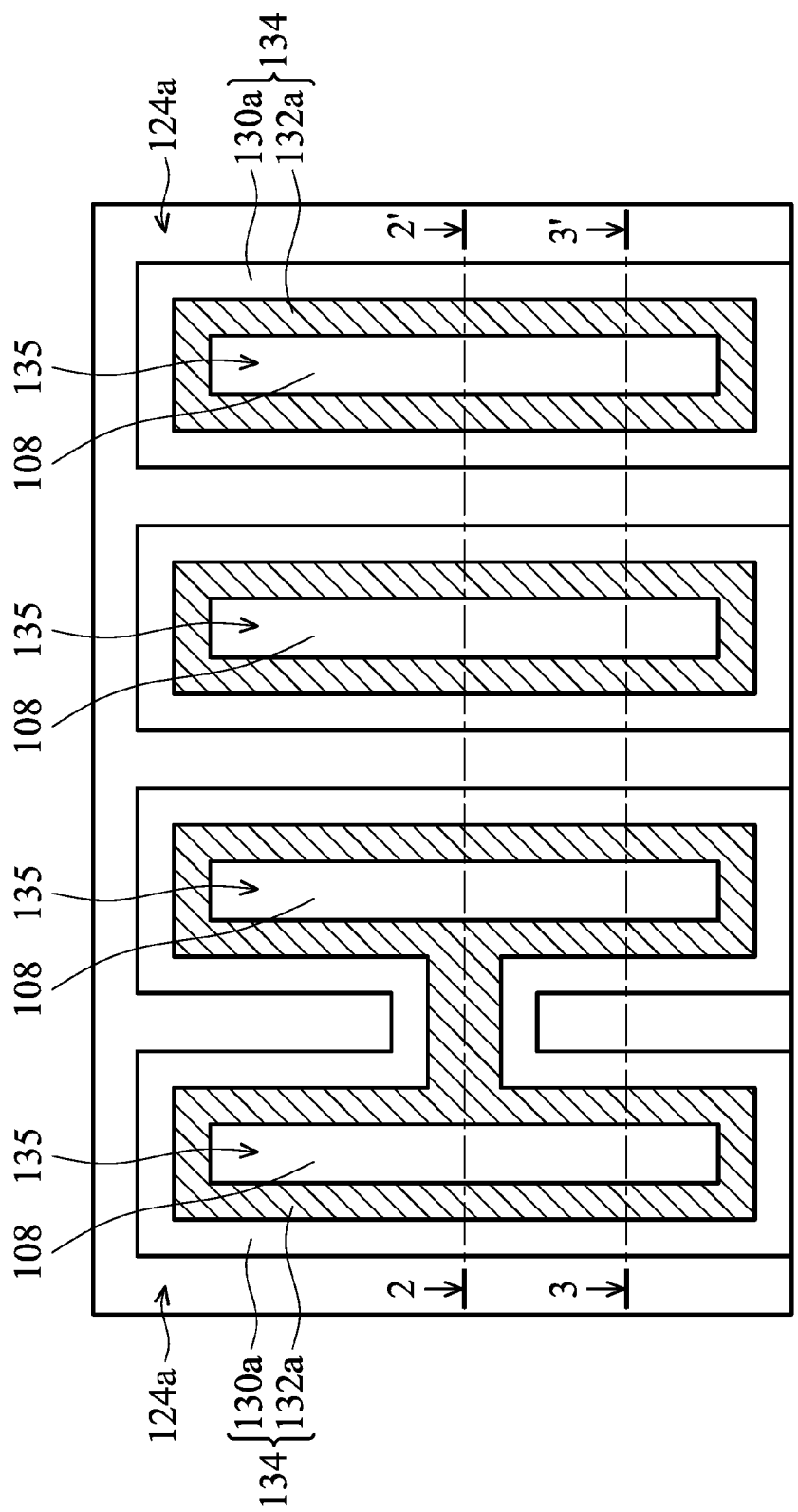
Figure 2C:
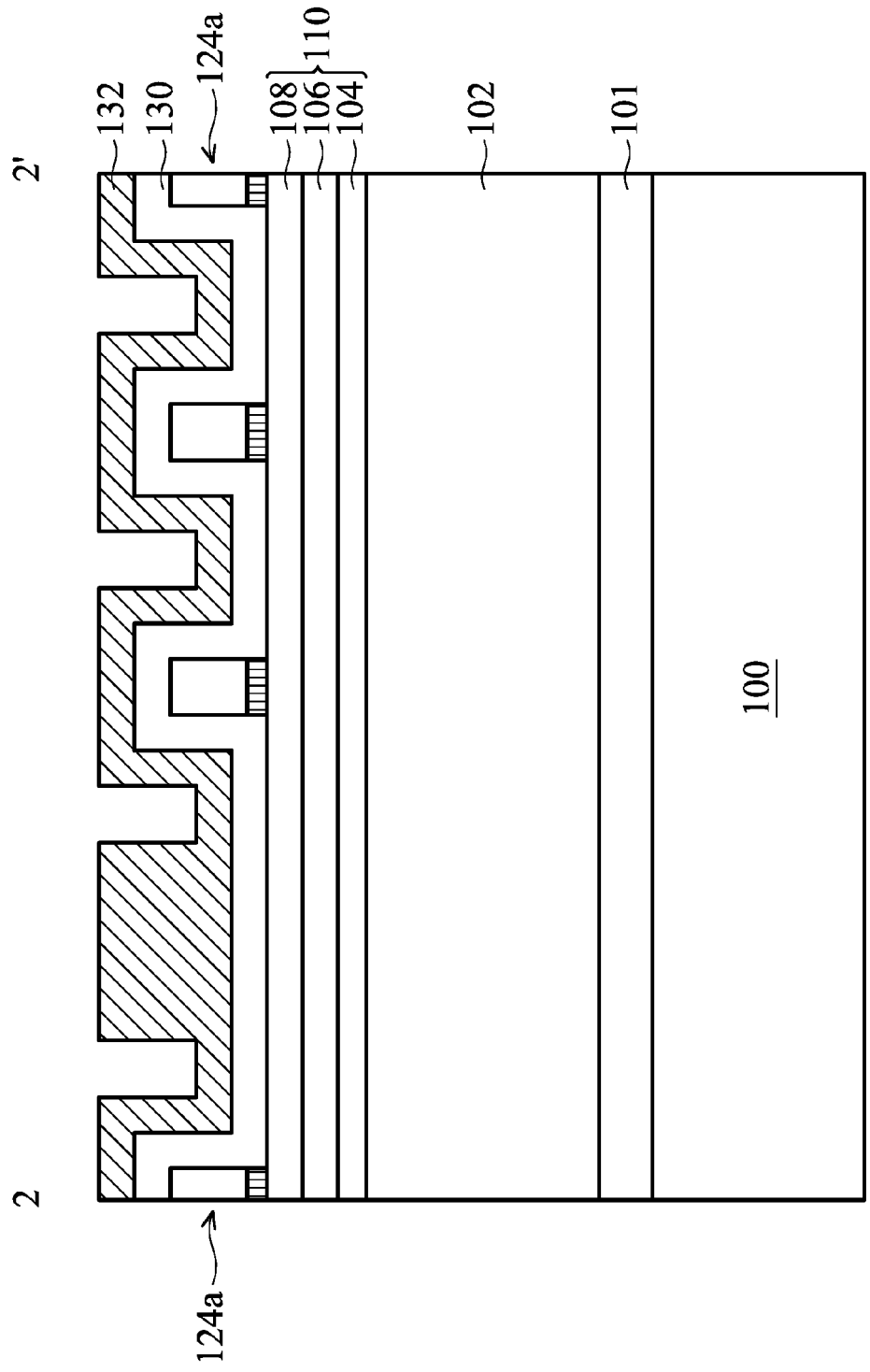
Figure 2D:
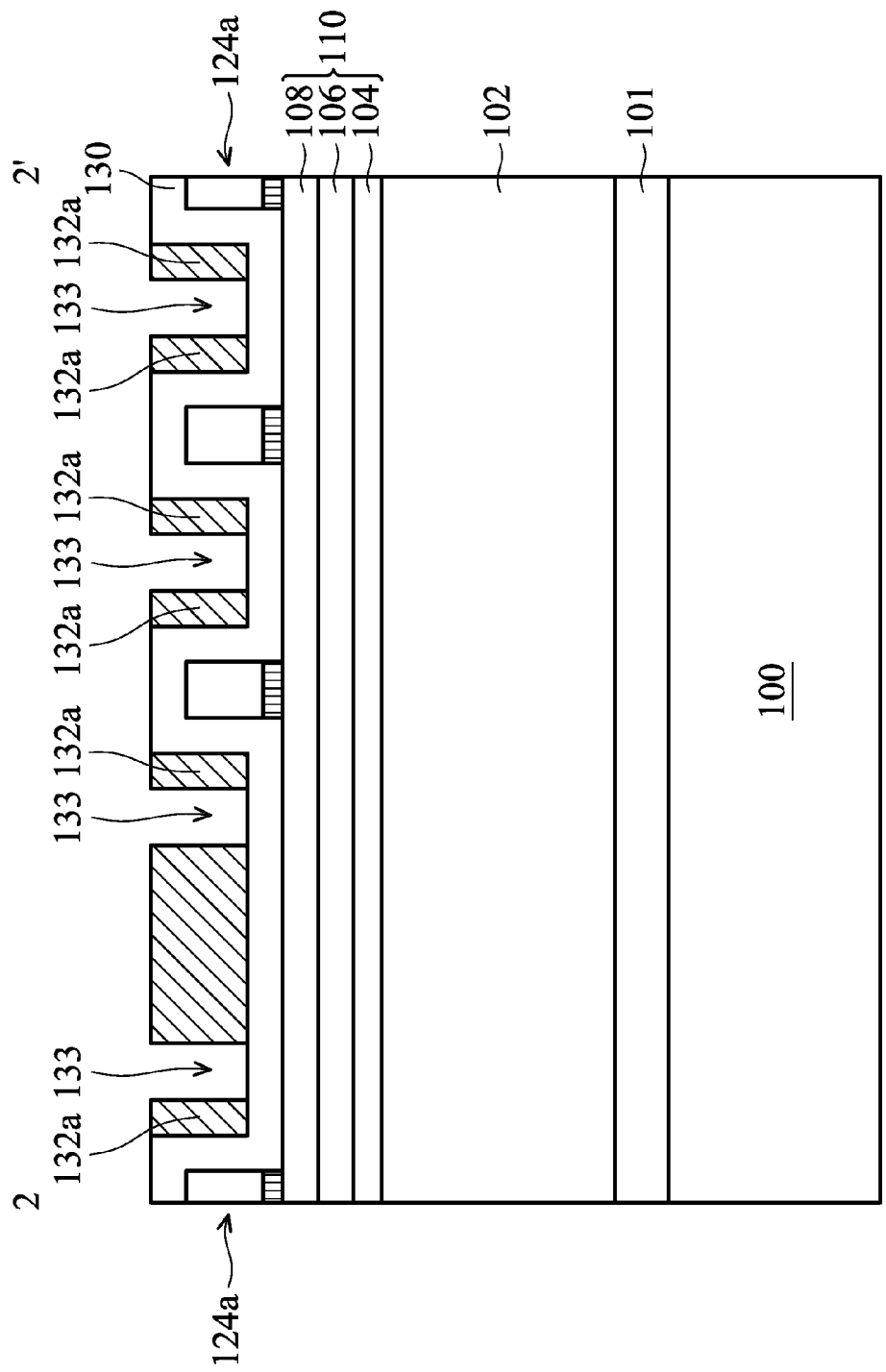
Figure 2E:
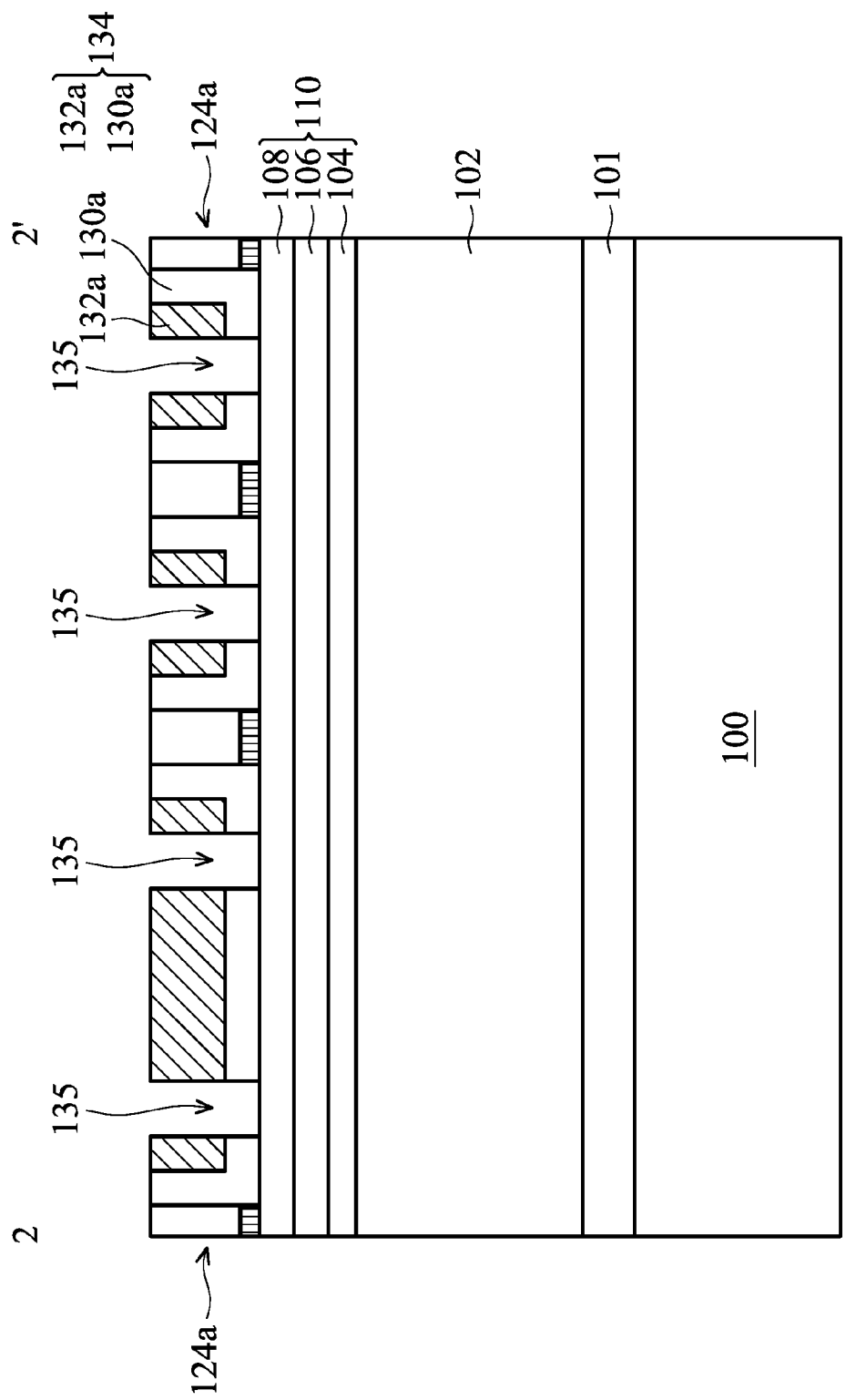
Figure 3C:
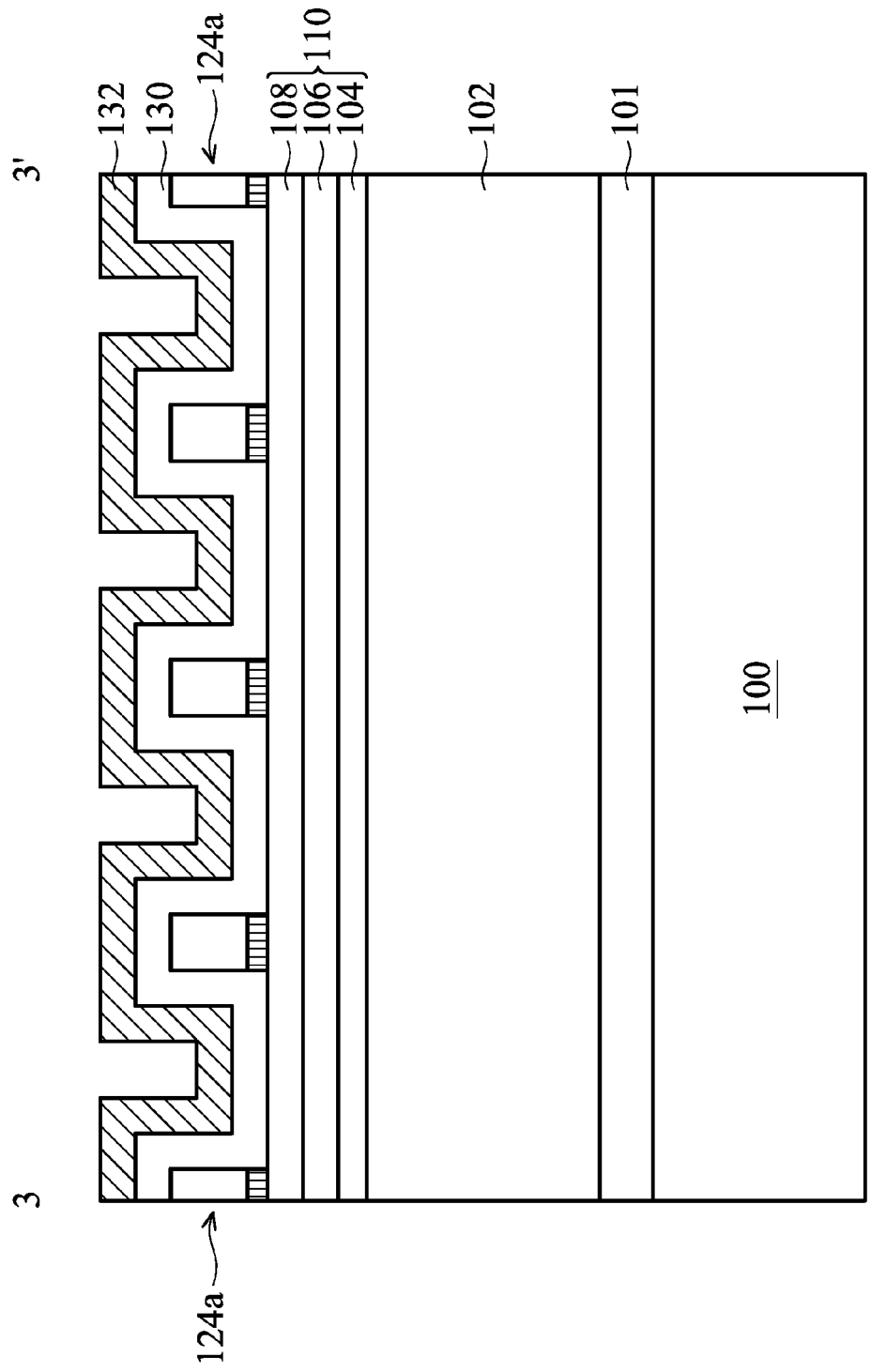

As shown in FIGS. 1C-1E, 2C-2E, and 3C-3E, spacer structures 134 are formed, in accordance with some embodiments. In FIGS. 1C, 2C, and 3C, a first spacer layer 132 and a second spacer layer 130 are conformally formed over the structure shown in FIGS. 1B, 2B, and 3B, in accordance with some embodiments, such that the first spacer layer 132 and the underlying second spacer layer 130 cover the second masking layer 108 and the sidewalls and top surface of each mandrel line 124a.

In some embodiments, the first spacer layer 132 is made of a material having a hardness higher than the second mandrel layer 122. For example, the first spacer layer 132 may include a dielectric material including metal nitride (such as AlN, TiN, or TaN), metal oxide (such as HfO, AlO$_x$, TiO$_x$), or the like. The first spacer layer 132 may be formed by a PVD process (such as RFPVD), an ALD process, a CVD process, or another suitable method.

In some embodiments, the second spacer layer 130 is also made of a material having a hardness higher than the second mandrel layer 122. For example, the second spacer layer 130 may include a dielectric material including metal nitride (such as AlN, TiN, or TaN), metal oxide (such as HfO, AlO$_x$, TiO$_x$), or the like. In these cases, the selected material of the second spacer layer 130 is different from that of the first spacer layer 132, such that the second spacer layer 130 has a higher or lower etching selectivity with the first spacer layer 132. The second spacer layer 130 may be formed by the same or a similar formation method as the first spacer layer 132. In some embodiments, the sum of the thickness of the first spacer layer 132 and that of the second spacer layer 130 is substantially equal to the width of the mandrel line 124a. For example, the first spacer layer 132 has a thickness in a range of about 50 nm to 300 nm, and the second spacer layer 132 has a thickness in a range of about 50 nm to 300 nm.

Figure 3D:
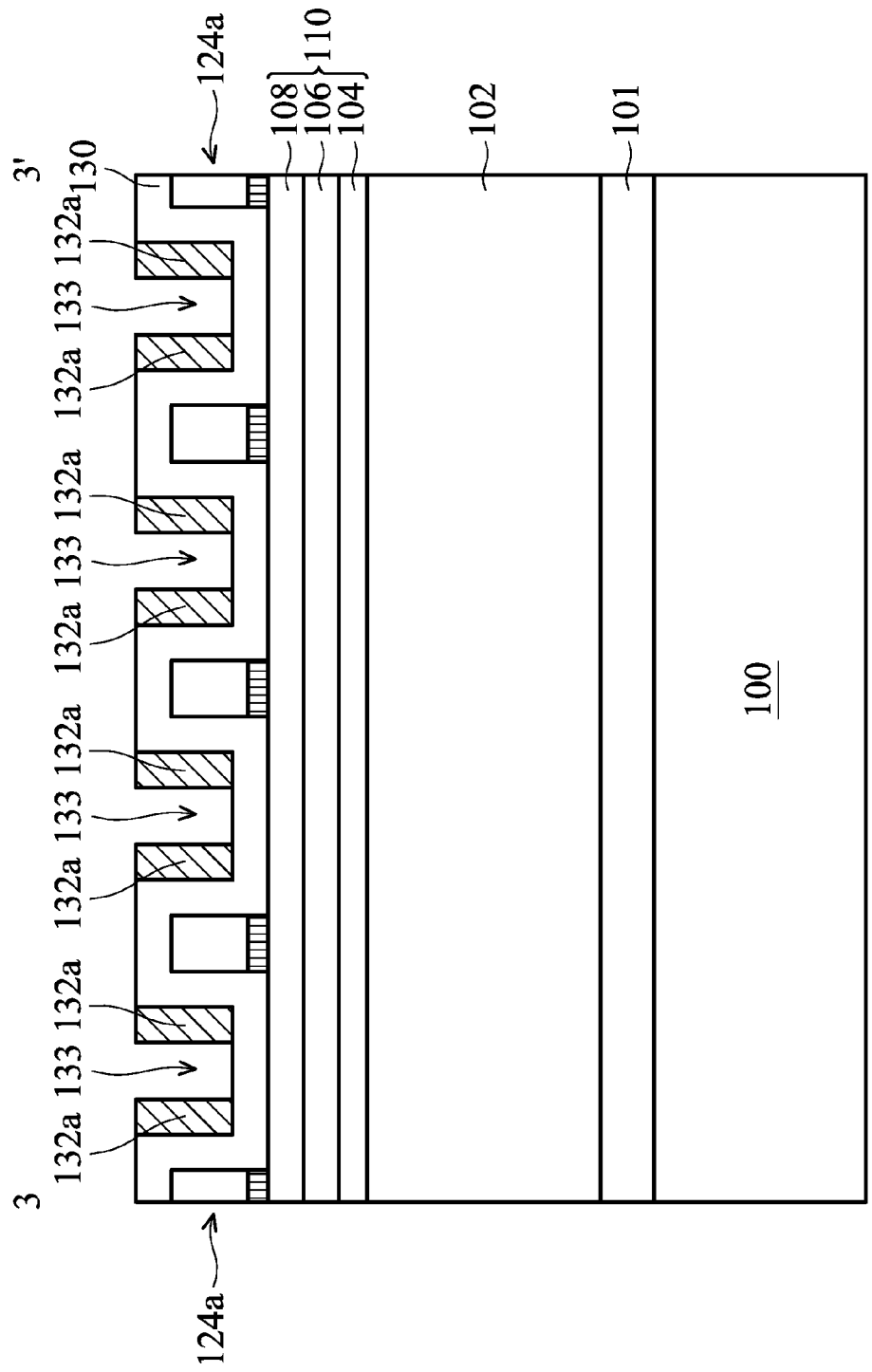

In FIGS. 1D, 2D, and 3D, first pacers 132a are formed on both sidewalls of each mandrel line 124a, in accordance with some embodiments. In some embodiments, the first spacer layer 132 is anisotropically etched to remove the horizontal portions of the first spacer layer 132, while the vertical portions of the first spacer layer 132 remain, and are hereinafter referred to as first pacers 132a. As a result, portions of the second spacer layer 130 above the second masking layer 108 are exposed from the openings 133 and portions of the second spacer layer 130 above the top surfaces of the mandrel lines 124a are exposed from the first pacers 132a. In some embodiments, the top surface of the second spacer layer 130 above the mandrel line 124a is substantially level with those of the corresponding first spacers 132a. The first pacers 132a define openings 133 between the mandrel lines 124a, and each opening 133 may have a width that is substantially equal to that of the mandrel line 124a.

Figure 3E:
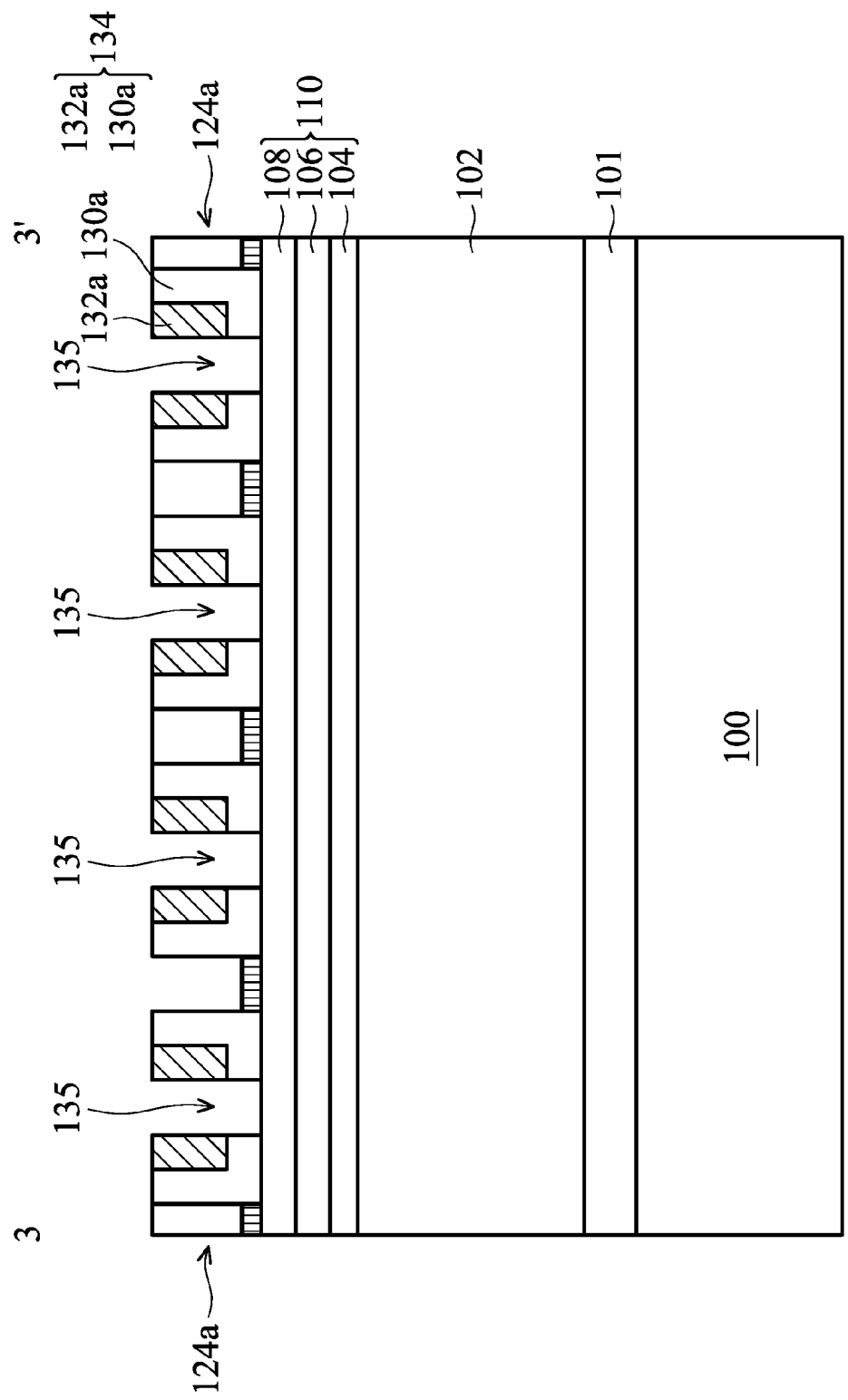

In FIGS. 1E, 2E, and 3E, second spacers 130a are formed on both sidewalls of each mandrel line 124a and covered by the corresponding first spacers 132a, in accordance with some embodiments. In some embodiments, the second spacer layer 130 is anisotropically etched to remove the horizontal portions of the second spacer layer 130 that are uncovered by the first spacers 132a, while the horizontal portions of the second spacer layer 130 that are covered by the first spacers 132a and the vertical portions of the second spacer layer 130 remain. The remaining portions of the second spacer layer 130 are L-shaped and are hereinafter referred to as second spacers 130a. As a result, spacer structures 134 are formed on the sidewalls of the respective mandrel lines 124a, so as to define first openings 135. Moreover, each of the mandrel lines 124a includes the first spacer 132a and the L-shaped second spacer 130a that is between the first spacer 132a and the corresponding mandrel line 124a.

In these cases, portions of the second masking layer 108 are exposed by the first openings 135 which are formed by extending the openings 133 (as shown in FIGS. 1D, 2D, and 3D). Moreover, the top surfaces of the mandrel lines 124a are also exposed from the spacer structures 134. In some embodiments, the top surface of the exposed mandrel line 124a is substantially level with that of the corresponding spacer structures 134. In some embodiments, each opening 135 may have a width that is substantially equal to that of the mandrel line 124a.

Figure 1F:
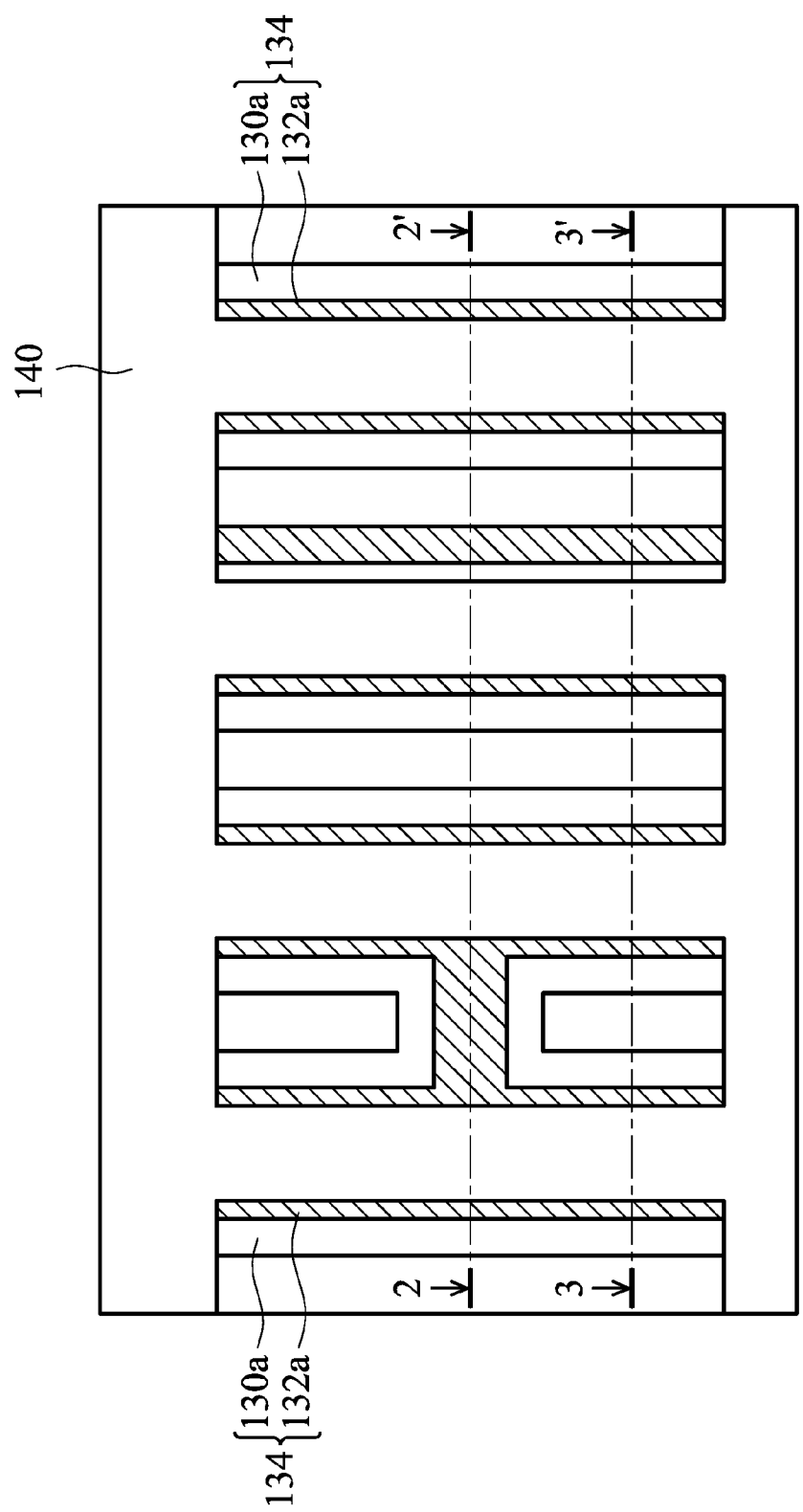
Figure 1G:
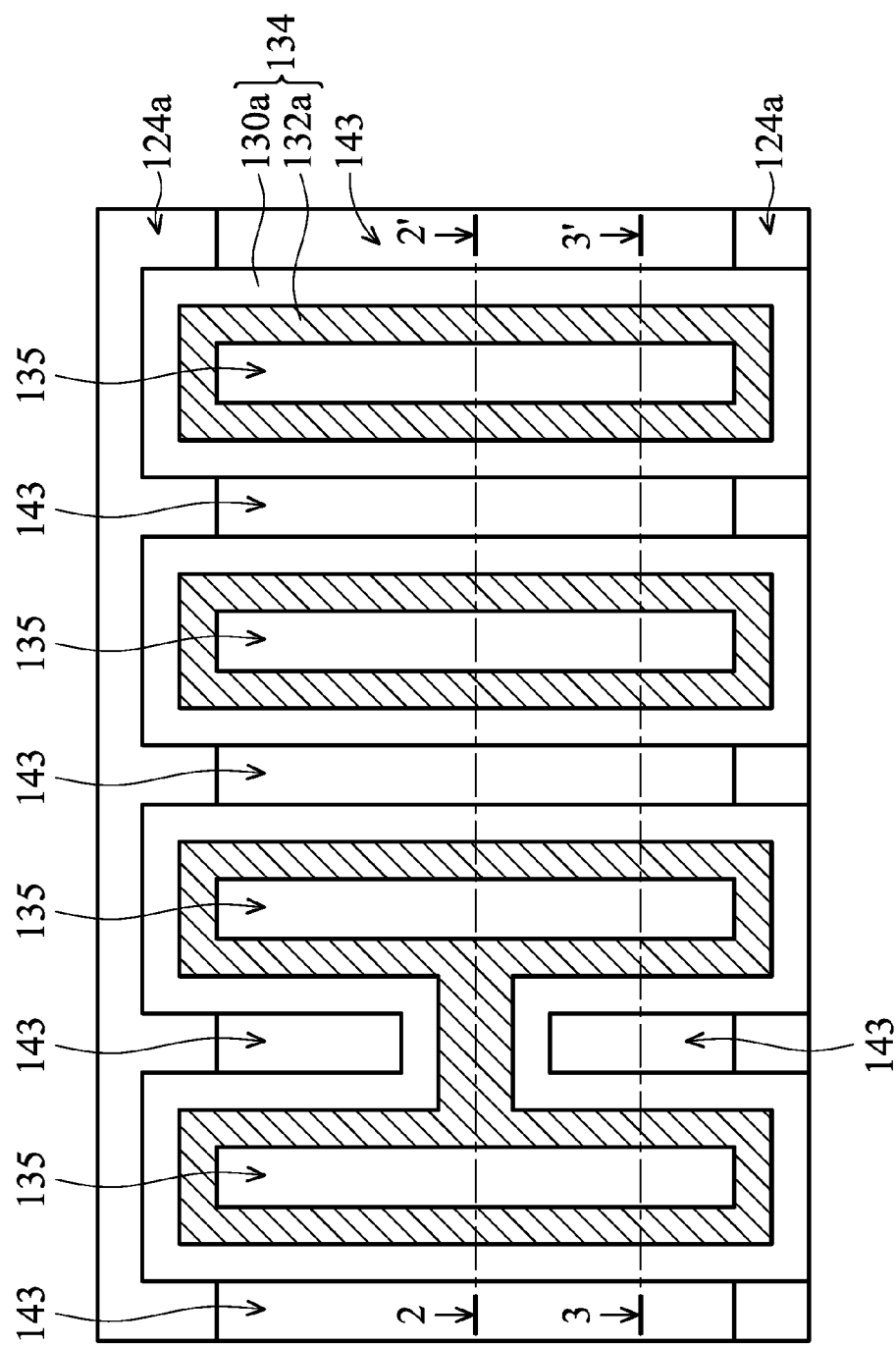
Figure 2F:
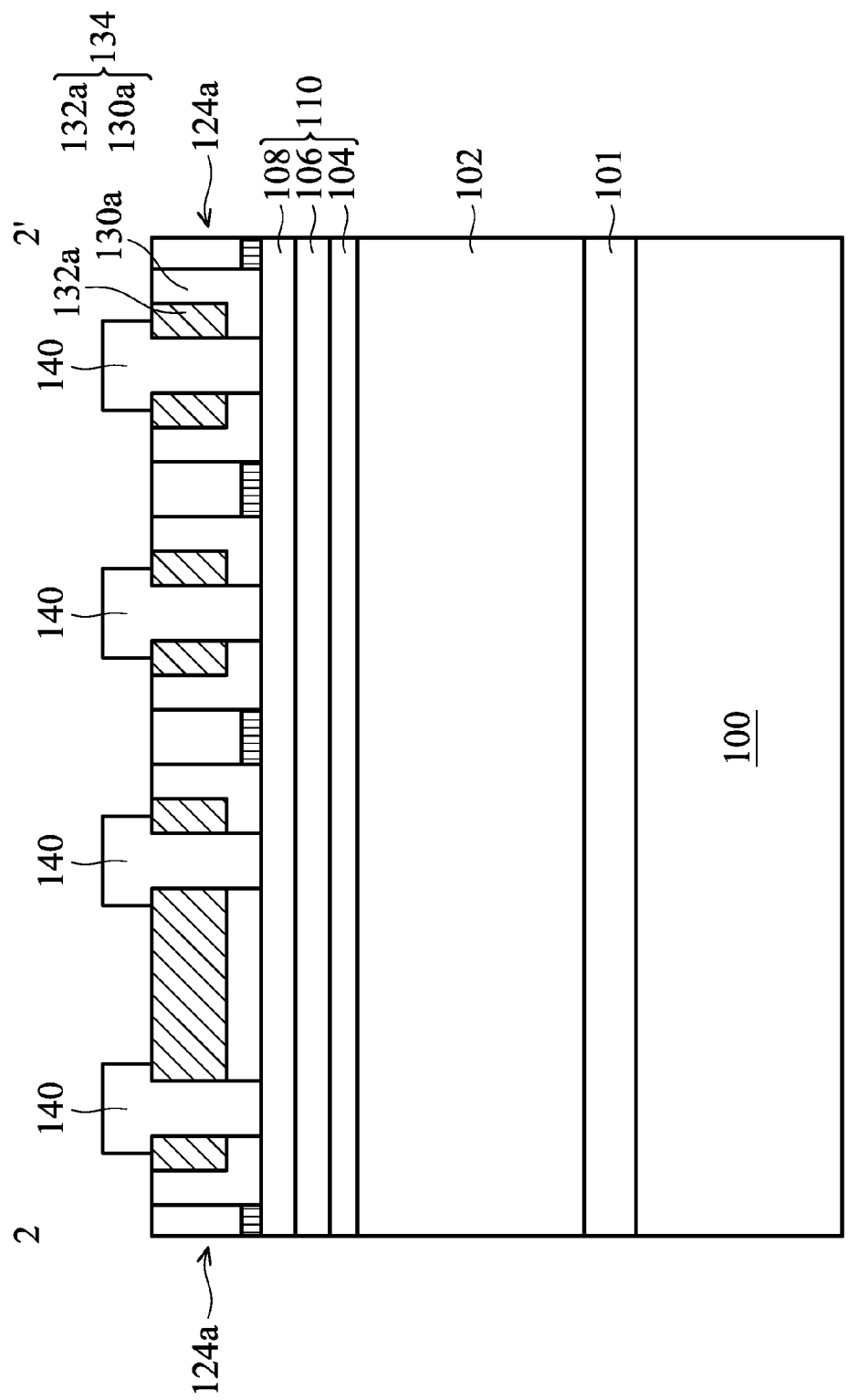
Figure 2G:
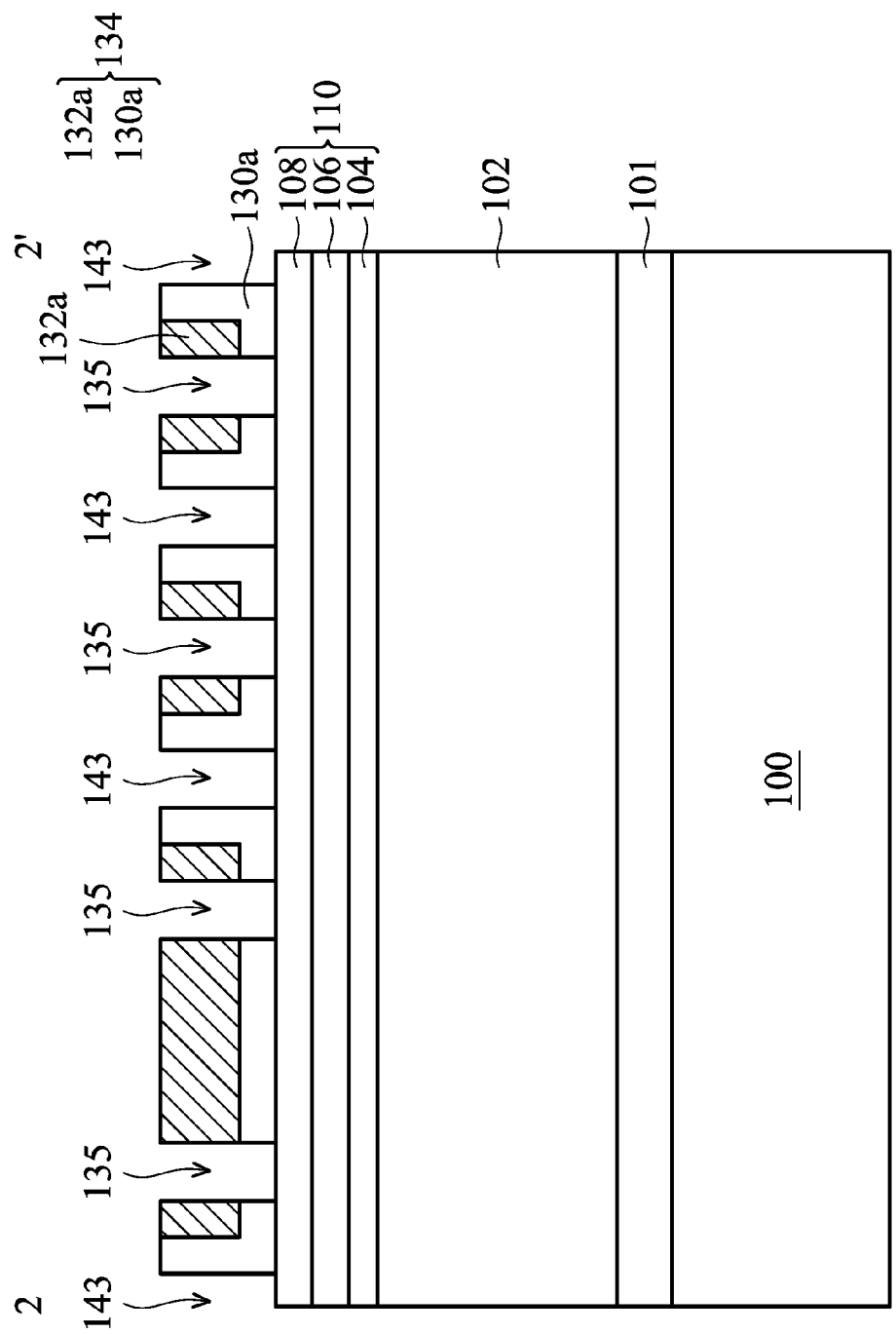
Figure 3F:
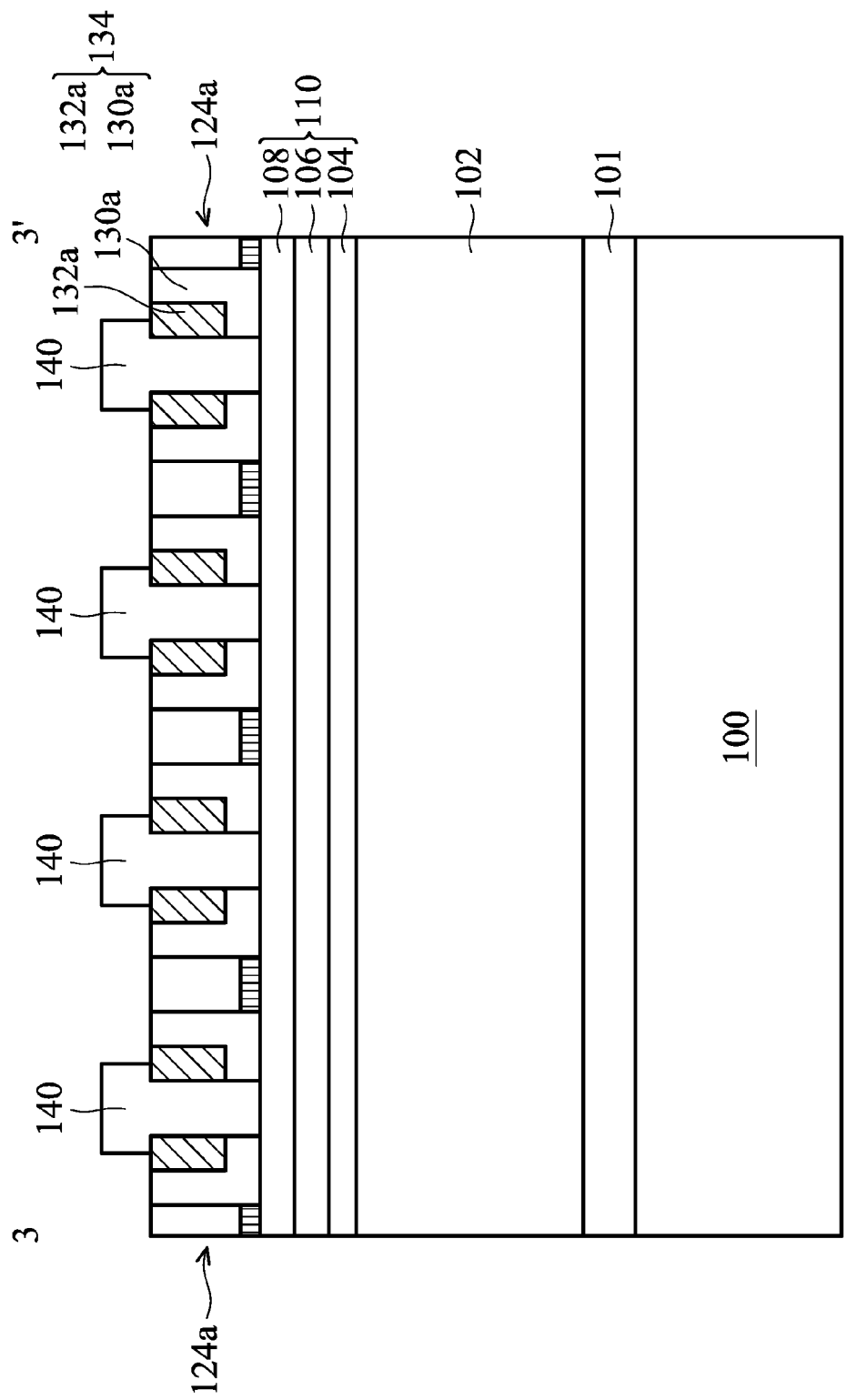

As shown in FIGS. 1F-1G, 2F-2G, and 3F-3G, mandrel lines 124 are removed, in accordance with some embodiments. In FIGS. 1F, 2F, and 3F, a masking layer (not shown) is formed over the structure shown in FIGS. 1E, 2E, and 3E, and fills the openings 135 (as indicated in FIGS. 1E, 2E, and 3E), in accordance with some embodiments. In some embodiments, the masking layer is a photoresist layer.

Figure 3G:
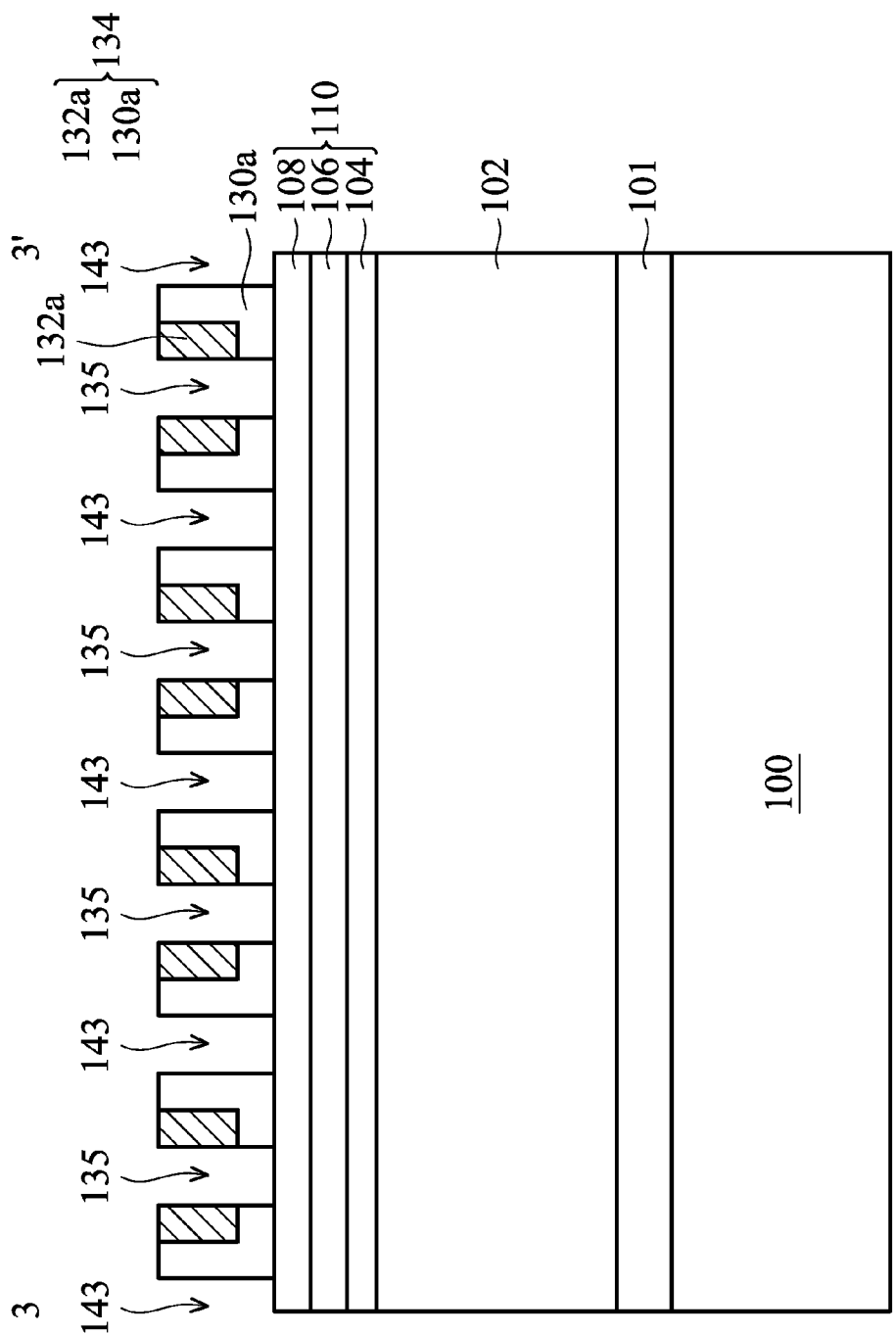

Afterwards, a photolithography process is performed on the masking layer, so as to form a masking pattern layer 140. In these cases, the masking pattern layer 140 fills the openings 135 and exposes the entire top surface of each mandrel line 124a and portions of each spacer structure 134. For example, the top surface of the first spacer 132a of each spacer structure 134 is partially covered by the masking pattern layer 140 and the entire top surface of the second spacer 130a of each spacer structure 134 is exposed from the masking pattern layer 140. In FIGS. 1G, 2G, and 3G, an etching process is performed on the exposed mandrel lines 124a, in accordance with some embodiments. The exposed mandrel lines 124a are entirely removed by the etch process, to define second openings 143 that are formed at the location of the removed mandrel lines 135. In some embodiments, the etching process includes a dry etching process (such as a plasma etching) or a wet etching process. In some embodiments, the second opening 143 exposes the second masking layer 208 and has a width that is substantially equal to that of the first opening 135.

In some embodiments, the second opening 143 has a width that is not equal to that of the first opening 135 due to variations in the manufacturing process. In these cases, a sidewall anisotropic etching process may be performed on the spacer structures 134 using an etchant after the removal of the mandrel lines 124a, such that the first spacer 132a and the second spacer 130a have different etching rates with the etchant. For example, the etching rate of the first spacer 132a may be higher than that of the second spacer 130a with the etchant when the first opening 135 has a width that is less than that of the second opening 143. Conversely, the etching rate of the first spacer 132a is lower than that of the second spacer 130a with the etchant when the first opening 135 has a width that is greater than that of the second opening 143. In some embodiments, the sidewall anisotropic etching process is a plasma etching process and the etchant includes an etching gas.

Figure 1H:
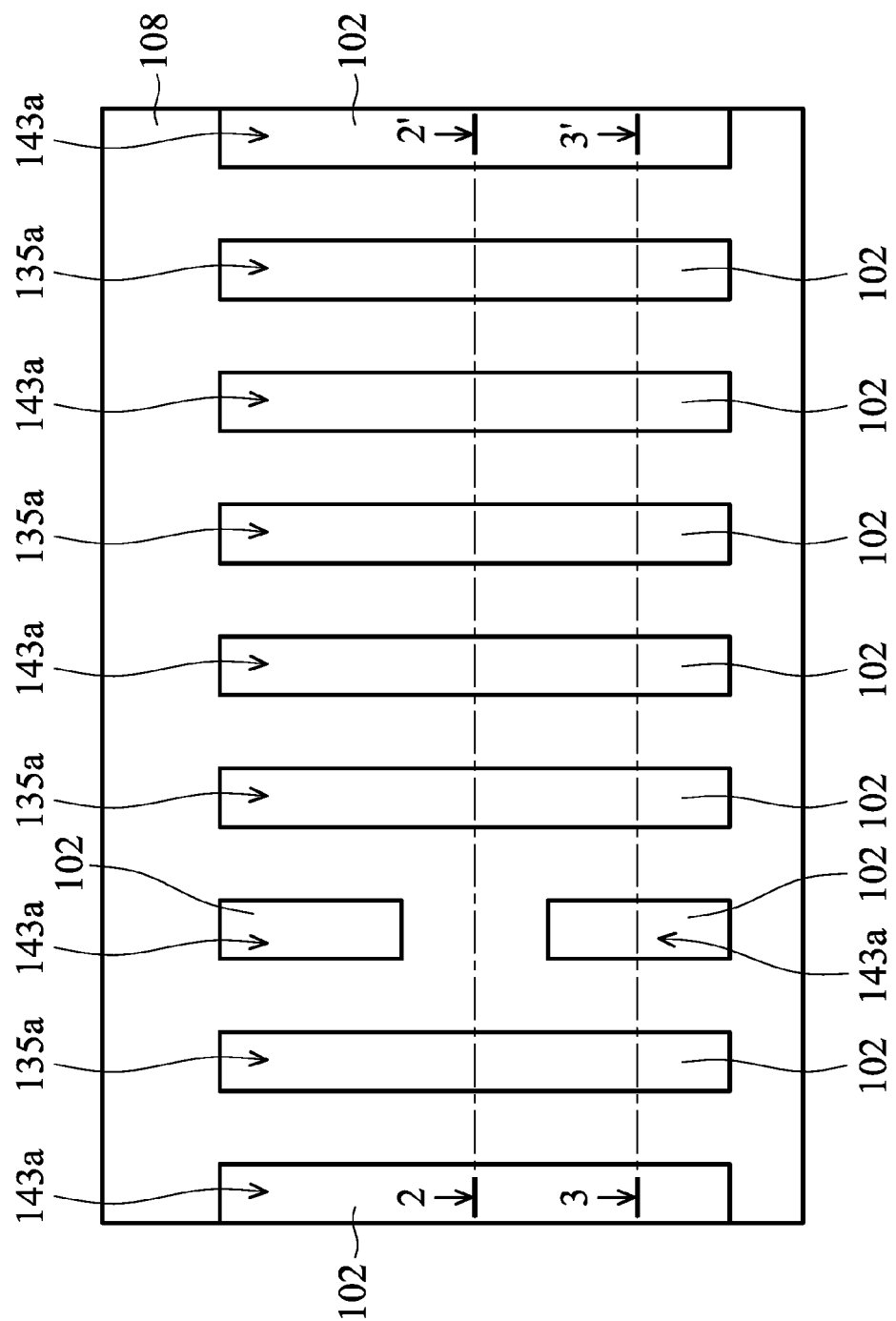
Figure 2H:
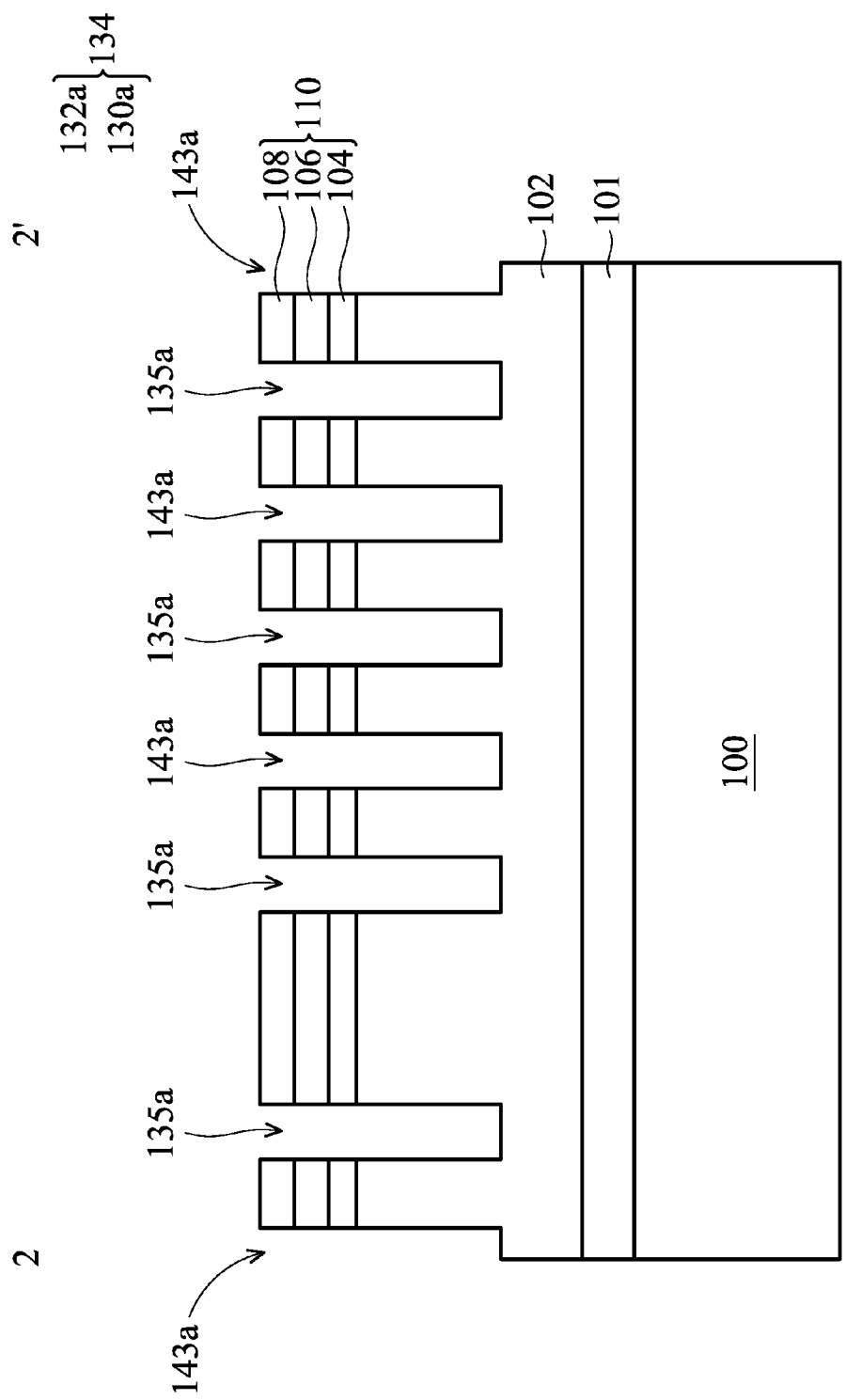
Figure 3H:
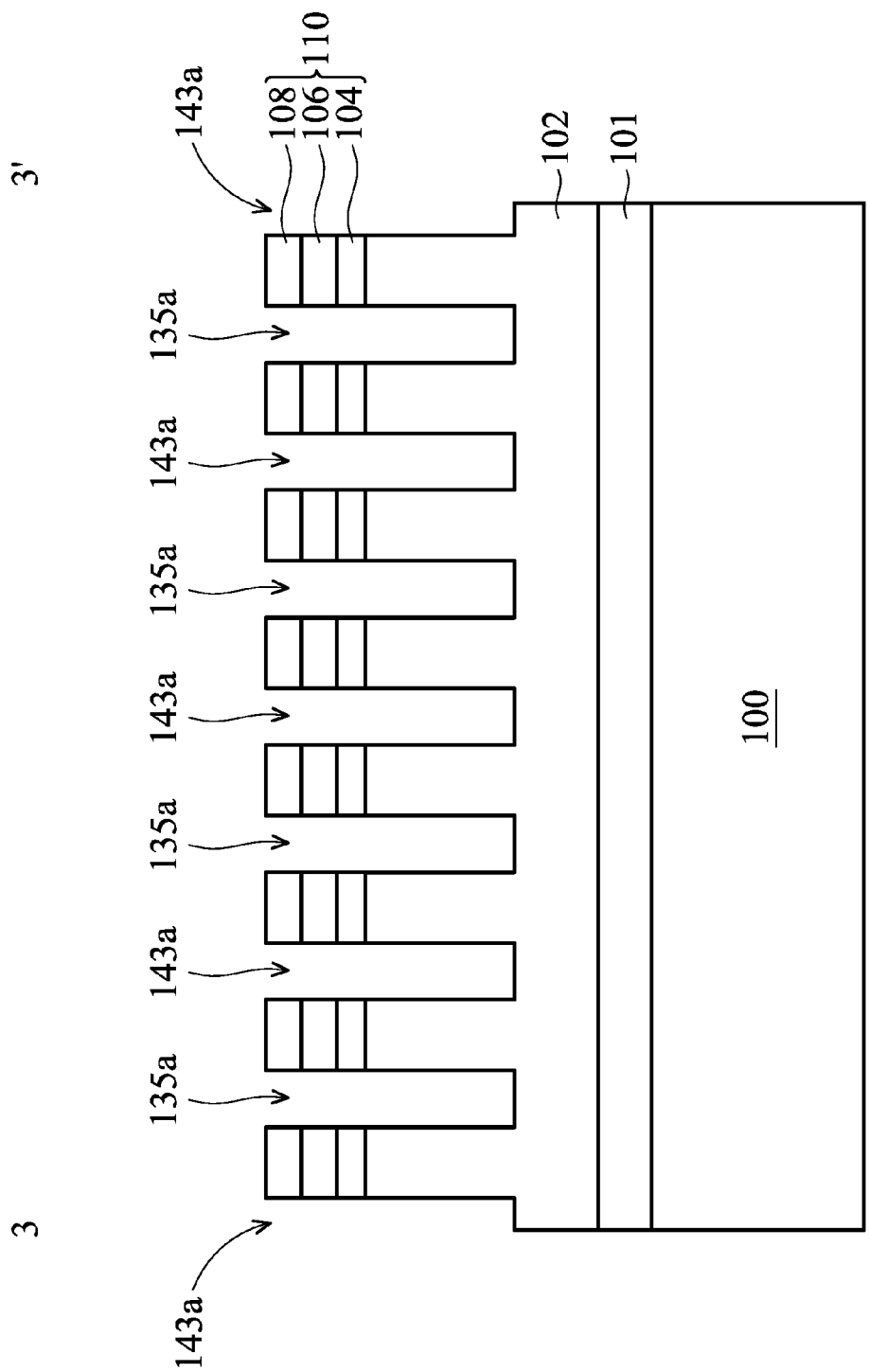

As shown in FIGS. 1H, 2H, and 3H, a target pattern defined by the first openings 135 and the second openings 143 (as indicated in FIGS. 1G, 2G, and 3G) is transferred into the target layer (i.e., the insulating layer 102), in accordance with some embodiments. In some embodiments, portions of the hard mask structure 110 that are exposed from the first openings 135 and the second openings 143 are etched using the spacer structures 134 (as indicated in FIGS. 1G, 2G, and 3G) as an etch mask, such that the first openings 135 and the second openings 143 are extended and pass through the hard mask structure 110 to expose the insulating layer 102. While the hard mask structure 110 is being etched, the spacer structures 134 may be entirely consumed. For example, after the second masking layer 108 of the hard mask structure 110 is etched to expose the underlying first masking layer 106 of the hard mask structure 110, the spacer structures 134 may be entirely consumed. In some embodiments, the hard mask structure 110 is etched using a dry etching process (such as a plasma etching) or a wet etching process.

Afterwards, the exposed portions of the insulating layer 102 are etched using the etched hard mask structure 110 as an etch mask, such that the target pattern defined by the first openings 135 and the second openings 143 is formed in the insulating layer 102. In some embodiments, the target pattern in the insulating layer 102 includes first trenches 135a corresponding to the first openings 135 and second trenches 143a corresponding to the second openings 143. In alternative embodiments, the target pattern in the insulating layer 102 includes via holes.

Figure 4:
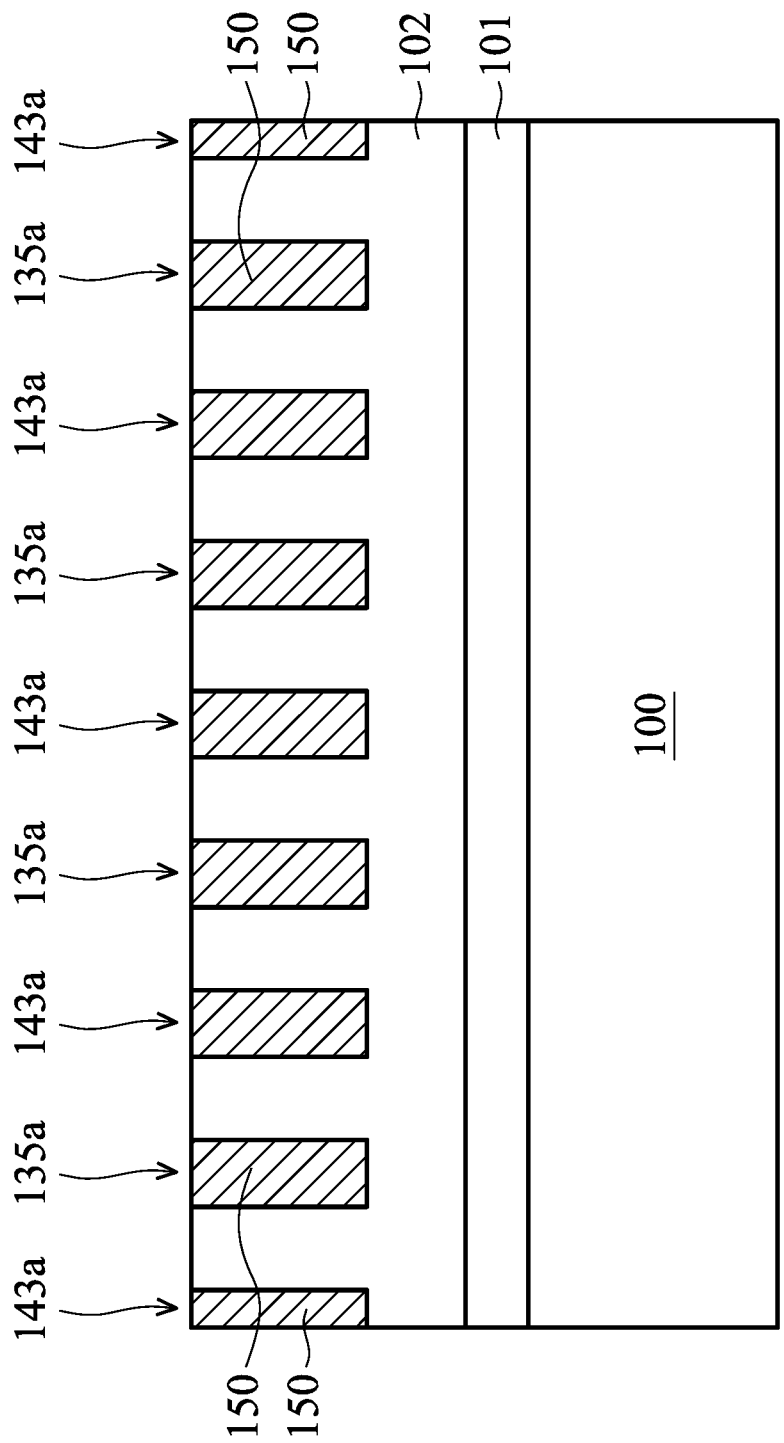
FIG. 4 is a cross-sectional view of a semiconductor device structure, in accordance with some embodiments.

FIG. 4 is a cross-sectional view of a semiconductor device structure, in accordance with some embodiments. As shown in FIG. 4, the semiconductor device structure includes the substrate 100, the insulating layer 101, and the insulating layer 102 with the target pattern shown in FIGS. 1H, 2H, and 3H. Moreover, conductive features 150 are formed in the first and second trenches 135a and 143a of the target pattern of the insulating layer 102. In some embodiments, the target pattern of the insulating layer 102 is formed by the method shown in FIGS. 1A-1H, 2A-2H, and 3A-3H. In some embodiments, the conductive features 150 include metal trenches or metal plugs. In these cases, the conductive features 150 formed in the first and second trenches 135a and 143a may have substantially the same depth and substantially the same critical dimension (CD).

Embodiments of the disclosure provide formation methods of a semiconductor device structure. According to some embodiments of the disclosure, since the first mandrel layer may serve as an etch stop layer for the cut mandrel etching process, damage of the hard mask structure can be mitigated. As a result, a target pattern can be precisely and successfully transferred into the hard mask structure and the underlying target layer, thereby increasing the depth uniformity of the trenches or via holes in the target layer.

Moreover, since the spacer structure includes two spacers with different etching rates, the width of the first opening or the second opening can be adjusted by a sidewall anisotropic etching process. As a result, the CD uniformity of the features in the target layer is improved.

In accordance with some embodiments, a method for forming a semiconductor device structure is provided. The method includes forming a mandrel masking structure over a target layer and patterning the mandrel masking structure to form mandrel lines parallel to each other. The method also includes forming spacer structures on sidewalls of the respective mandrel lines to define first openings. Each of the spacer structures includes a first spacer and a second spacer between the first spacer and the corresponding mandrel line. The method also includes removing the mandrel lines to define second openings and etching the target layer through the first and second openings to form a target pattern therein.

In accordance with some embodiments, a method for forming a semiconductor device structure is provided. The method includes forming a hard mask structure over a target layer and forming a mandrel masking structure over the hard mask structure. The method also includes patterning the mandrel masking structure to form mandrel lines parallel to each other and forming spacer structures on sidewalls of the respective mandrel lines to define first openings. Each of the spacer structures includes a first spacer and a second spacer between the first spacer and the corresponding mandrel line. The method also includes removing the mandrel lines to define second openings and successively etching the hard mask structure and the target layer through the first and second openings to form a target pattern in the target layer.

In accordance with some embodiments, a method for forming a semiconductor device structure is provided. The method includes forming a mandrel masking structure over an insulating layer. The mandrel masking structure includes a first mandrel layer and a second mandrel layer on the first mandrel layer. The method also includes patterning the second mandrel layer of the mandrel masking structure to form a cut opening therein and exposing the first mandrel layer. The method also includes patterning the mandrel masking structure to form mandrel lines parallel to each other. One of the mandrel lines is divided into two portions by the cut opening. The method also includes forming spacer structures on sidewalls of the respective mandrel lines to define first openings. Each of the spacer structures includes a first spacer and a second spacer between the first spacer and the corresponding mandrel line. The method also includes removing the mandrel lines to define second openings and anisotropically etching the spacer structures using an etchant, such that the first spacer and second spacer have different etching rates with the etchant. The method also includes etching the insulating layer through the first and second openings to form a target pattern in the target layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a mandrel masking structure over a target layer;
    patterning the mandrel masking structure to form a plurality of mandrel lines parallel to each other;
    forming a plurality of spacer structures on sidewalls of the respective mandrel lines to define a plurality of first openings, wherein each of the spacer structures comprises a first spacer and a second spacer between the first spacer and a corresponding mandrel line;

removing the mandrel lines to define a plurality of second openings;

etching the target layer through the first and second openings to form a target pattern therein; and performing a sidewall anisotropic etching process on the spacer structures using an etchant after the removal of the mandrel lines and before the etching of the target layer, such that the first spacer and the second spacer have different etching rates with the etchant.

2. The method as claimed in claim 1, wherein the etching rate of the first spacer is higher than that of the second spacer when the first opening has a width that is less than that of the second opening.

3. The method as claimed in claim 1, wherein the etching rate of the first spacer is lower than that of the second spacer when the first opening has a width that is greater than that of the second opening.

4. The method as claimed in claim 1, wherein the target pattern comprises a plurality of first trenches corresponding to the first openings and a plurality of second trenches and corresponding to the second openings.

5. The method as claimed in claim 1, wherein the mandrel masking structure comprises a first mandrel layer and a second mandrel layer on the first mandrel layer.

6. The method as claimed in claim 5, wherein the step of patterning the mandrel masking structure comprises forming a cut opening in the second mandrel layer, such that the first mandrel layer is exposed therefrom and one of the mandrel lines is divided into two portions by the cut opening.

7. The method as claimed in claim 5, wherein the first spacer and the second spacer have a hardness higher than that of the second mandrel layer.

8. The method as claimed in claim 1, wherein the first opening has a width that is different from that of the second opening.

9. A method for forming a semiconductor device structure, comprising:

forming a hard mask structure over a target layer;

forming a mandrel masking structure over the hard mask structure;

patterning the mandrel masking structure to form a plurality of mandrel lines parallel to each other, wherein each of the plurality of mandrel lines comprises a first mandrel layer and a second mandrel layer on the first mandrel layer;

forming a plurality of spacer structures on sidewalls of the respective mandrel lines to define a plurality of first openings, wherein each of the spacer structures comprises a first spacer and a second spacer between the first spacer and a corresponding mandrel line;

removing the mandrel lines to define a plurality of second openings; and successively etching the hard mask structure and the target layer through the first and second openings to form a target pattern in the target layer.

10. The method as claimed in claim 9, further comprising performing a sidewall anisotropic etching process on the spacer structures using an etchant after the removal of the mandrel lines and before the etching of the hard mask structure and the target layer, such that the first spacer and the second spacer have different etching rates with the etchant.

11. The method as claimed in claim 10, wherein the etching rate of the first spacer is higher than that of the second spacer when the first opening has a width that is less than that of the second opening.

12. The method as claimed in claim 10, wherein the etching rate of the first spacer is lower than that of the second spacer when the first opening has a width that is greater than that of the second opening.

13. The method as claimed in claim 9, wherein the step of patterning the mandrel masking structure comprises forming a cut opening in the second mandrel layer, such that the first mandrel layer is exposed therefrom and one of the mandrel lines is divided into two portions by the cut opening.

14. The method as claimed in claim 9, wherein the first spacer and the second spacer have a hardness higher than that of the second mandrel layer.

15. The method as claimed in claim 9, wherein the hard mask structure comprises a first masking layer and a second masking layer on the first masking layer.

16. The method as claimed in claim 15, wherein the second masking layer has a hardness higher than that of the second mandrel layer.

17. The method as claimed in claim 9, wherein the first opening has a width that is different from that of the second opening.

18. A method for forming a semiconductor device structure, comprising:

forming a mandrel masking structure over an insulating layer, wherein the mandrel masking structure comprises a first mandrel layer and a second mandrel layer on the first mandrel layer;

patterning the second mandrel layer of the mandrel masking structure to form a cut opening therein and exposing the first mandrel layer;

patterning the mandrel masking structure to form a plurality of mandrel lines parallel to each other, wherein one of the mandrel lines is divided into two portions by the cut opening;

forming a plurality of spacer structures on sidewalls of the respective mandrel lines to define a plurality of first openings, wherein each of the spacer structures comprises a first spacer and a second spacer between the first spacer and a corresponding mandrel line;

removing the mandrel lines to define a plurality of second openings;

performing a sidewall anisotropic etching process on the spacer structures by an etchant, such that the first spacer and the second spacer have different etching rates with the etchant; and etching the insulating layer through the first and second openings to form a target pattern in the target layer.

19. The method as claimed in claim 18, further comprising a hard mask structure between the insulating layer and the mandrel masking structure, wherein the hard mask structure comprises a first masking layer and a second masking layer on the first masking layer.

20. The method as claimed in claim 19, wherein the first spacer, the second spacer, and the second masking layer have a hardness higher than that of the second mandrel layer.

* * * * *